United States Patent
Duong et al.

(10) Patent No.: US 8,115,217 B2
(45) Date of Patent: Feb. 14, 2012

(54) SYSTEMS AND METHODS FOR PACKAGING LIGHT-EMITTING DIODE DEVICES

(75) Inventors: Dung T. Duong, Cedar Park, TX (US); Paul N. Winberg, Rollingwood, TX (US); Oscar Vaz, Austin, TX (US)

(73) Assignee: Illumitex, Inc., Austin, TX (US)

( * ) Notice: Subject to any disclaimer, the term of this patent is extended or adjusted under 35 U.S.C. 154(b) by 104 days.

(21) Appl. No.: 12/636,280

(22) Filed: Dec. 11, 2009

(65) Prior Publication Data
US 2010/0148193 A1 Jun. 17, 2010

Related U.S. Application Data

(60) Provisional application No. 61/121,874, filed on Dec. 11, 2008, provisional application No. 61/121,870, filed on Dec. 11, 2008.

(51) Int. Cl.
*H01L 33/00* (2010.01)
*H01L 21/50* (2006.01)
(52) U.S. Cl. ............. 257/88; 257/98; 257/E33.056; 257/E33.061; 257/E21.499; 438/27; 438/28
(58) Field of Classification Search ............... 257/88, 257/98, E33.056, E33.061, E21.499; 438/28, 438/27
See application file for complete search history.

(56) References Cited

U.S. PATENT DOCUMENTS

| | | |
|---|---|---|
| 1,670,837 A | 5/1828 | Blackmore |
| 3,981,023 A | 9/1976 | King |
| 3,988,633 A | 10/1976 | Shurgan et al. |
| 4,125,890 A | 11/1978 | Nixon, Jr. |
| 4,180,755 A | 12/1979 | Nixon, Jr. |
| 4,239,369 A | 12/1980 | English et al. |
| 4,304,479 A | 12/1981 | Van Allen |
| 4,388,633 A | 6/1983 | Vasudev |

(Continued)

FOREIGN PATENT DOCUMENTS

CN 101385145 A 3/2009

(Continued)

OTHER PUBLICATIONS

International Search Report and Written Opinion (completed Feb. 1, 2010) for International Patent Application No. PCT/US09/67701, mailed Feb. 25, 2010, 7 pgs.

(Continued)

*Primary Examiner* — Luan C Thai
(74) *Attorney, Agent, or Firm* — Sprinkle IP Law Group

(57) ABSTRACT

Embodiments disclosed herein provide packaged LED devices in which the majority of the emitted light comes out the top of each LED chip with very little side emissions. Because light only comes out from the top, phosphor deposition and color temperature control can be significantly simplified. A package LED may include a housing positioned on a supporting submount, sized and dimensioned to accommodate a single LED chip or an array of LED chips. The LED chip(s) may be attached to the submount utilizing the Gold-to-Gold Interconnect (GGI) process or solder-based approaches. In some embodiments, phosphor may be deposited on top of the LED chip(s) or sandwiched between glass plates on top of the LED chip(s). The phosphor layer may be inside or on top of the housing and be secured to the housing utilizing an adhesive. The housing may be adhered to the submount utilizing a thermal epoxy.

30 Claims, 8 Drawing Sheets

U.S. PATENT DOCUMENTS

| | | | |
|---|---|---|---|
| 4,439,910 A | 4/1984 | Vasudev |
| 4,486,364 A | 12/1984 | Takahashi |
| 4,501,637 A | 2/1985 | Mitchell et al. |
| 4,716,507 A | 12/1987 | Ames |
| 4,728,999 A | 3/1988 | Dannatt et al. |
| 4,740,259 A | 4/1988 | Heinen |
| 4,799,136 A | 1/1989 | Molnar |
| 4,841,344 A | 6/1989 | Heinen |
| 4,966,862 A | 10/1990 | Edmond |
| 5,036,339 A | 7/1991 | Hediger |
| 5,087,949 A | 2/1992 | Haitz |
| 5,114,513 A | 5/1992 | Hosokawa |
| 5,126,929 A | 6/1992 | Cheselke |
| 5,151,718 A | 9/1992 | Nelson |
| 5,174,649 A | 12/1992 | Alston |
| 5,218,216 A | 6/1993 | Manabe et al. |
| 5,233,204 A | 8/1993 | Fletcher et al. |
| 5,251,117 A | 10/1993 | Nagai |
| 5,272,108 A | 12/1993 | Kozawa et al. |
| 5,278,433 A | 1/1994 | Manabe et al. |
| 5,281,830 A | 1/1994 | Kotaki et al. |
| 5,315,490 A | 5/1994 | Bastable |
| 5,369,289 A | 11/1994 | Tamaki et al. |
| 5,523,591 A | 6/1996 | Fleming et al. |
| 5,528,720 A | 6/1996 | Winston |
| 5,563,422 A | 10/1996 | Nakamura et al. |
| 5,578,156 A | 11/1996 | Kamakura et al. |
| 5,587,593 A | 12/1996 | Koide et al. |
| 5,620,557 A | 4/1997 | Manabe et al. |
| 5,652,438 A | 7/1997 | Sassa et al. |
| 5,654,831 A | 8/1997 | Byren et al. |
| 5,667,297 A | 9/1997 | Maassen |
| 5,700,713 A | 12/1997 | Yamazaki et al. |
| 5,739,554 A | 4/1998 | Edmond et al. |
| 5,780,867 A | 7/1998 | Fritz et al. |
| 5,790,583 A | 8/1998 | Ho |
| 5,813,753 A | 9/1998 | Vriens et al. |
| 5,839,424 A | 11/1998 | Hauser |
| 5,846,844 A | 12/1998 | Akasaki et al. |
| 5,862,167 A | 1/1999 | Sassa et al. |
| 5,912,477 A | 6/1999 | Negley |
| 5,945,689 A | 8/1999 | Koike et al. |
| 5,953,469 A | 9/1999 | Zhou |
| 5,959,401 A | 9/1999 | Asami et al. |
| 5,998,925 A | 12/1999 | Shimizu et al. |
| 6,005,722 A | 12/1999 | Butterworth et al. |
| 6,008,539 A | 12/1999 | Shibata et al. |
| 6,023,076 A | 2/2000 | Shibata |
| 6,066,861 A | 5/2000 | Hohn et al. |
| 6,078,064 A | 6/2000 | Ming-Jiunn et al. |
| 6,093,941 A | 7/2000 | Russell |
| 6,118,908 A | 9/2000 | Bischel |
| 6,133,589 A | 10/2000 | Krames |
| 6,144,536 A | 11/2000 | Zimmerman et al. |
| 6,169,294 B1 | 1/2001 | Biing-Jye et al. |
| 6,177,761 B1 | 1/2001 | Pelka et al. |
| 6,185,051 B1 | 2/2001 | Chen et al. |
| 6,194,742 B1 | 2/2001 | Kern et al. |
| 6,201,262 B1 | 3/2001 | Edmond et al. |
| 6,221,683 B1 | 4/2001 | Nirsche et al. |
| 6,222,207 B1 | 4/2001 | Carter-Coman et al. |
| 6,229,160 B1 | 5/2001 | Krames |
| 6,229,782 B1 | 5/2001 | Wang et al. |
| 6,257,737 B1 | 7/2001 | Marshall et al. |
| 6,258,618 B1 | 7/2001 | Lester |
| 6,271,622 B1 | 8/2001 | Coushaine et al. |
| 6,274,924 B1 | 8/2001 | Carey et al. |
| 6,287,947 B1 | 9/2001 | Ludowise et al. |
| 6,307,218 B1 | 10/2001 | Steigerwald et al. |
| 6,310,364 B1 | 10/2001 | Uemura |
| 6,323,063 B2 | 11/2001 | Krames |
| 6,331,450 B1 | 12/2001 | Uemura |
| 6,335,999 B1 | 1/2002 | Winston |
| 6,337,493 B1 | 1/2002 | Tanizawa et al. |
| D453,745 S | 2/2002 | Suenaga |
| 6,350,041 B1 | 2/2002 | Tarsa et al. |
| 6,351,069 B1 | 2/2002 | Lowery et al. |
| 6,356,700 B1 | 3/2002 | Strobl |
| 6,361,192 B1 | 3/2002 | Fussell et al. |
| 6,364,487 B1 | 4/2002 | Weber et al. |
| 6,377,535 B1 | 4/2002 | Chen et al. |
| 6,410,942 B1 | 6/2002 | Thibeault |
| 6,417,019 B1 | 7/2002 | Mueller et al. |
| 6,443,594 B1 | 9/2002 | Marshall et al. |
| 6,445,011 B1 | 9/2002 | Hirano et al. |
| 6,452,214 B2 | 9/2002 | Kaneyama et al. |
| 6,459,100 B1 | 10/2002 | Doverspike et al. |
| 6,478,453 B2 | 11/2002 | Lammers et al. |
| 6,486,499 B1 | 11/2002 | Krames et al. |
| 6,489,636 B1 | 12/2002 | Goetz et al. |
| 6,501,102 B2 | 12/2002 | Mueller-Mach et al. |
| 6,502,956 B1 | 1/2003 | Wu |
| 6,504,171 B1 | 1/2003 | Grillot et al. |
| 6,504,179 B1 | 1/2003 | Ellens et al. |
| 6,514,782 B1 | 2/2003 | Wierer, Jr. et al. |
| 6,515,313 B1 | 2/2003 | Ibbetson et al. |
| 6,526,082 B1 | 2/2003 | Corzine et al. |
| 6,526,201 B1 | 2/2003 | Mrakovich et al. |
| 6,527,411 B1 | 3/2003 | Sayers |
| 6,534,797 B1 | 3/2003 | Edmond et al. |
| 6,541,800 B2 | 4/2003 | Barnett et al. |
| 6,547,416 B2 | 4/2003 | Pashley et al. |
| 6,547,423 B2 | 4/2003 | Marshall |
| 6,563,142 B2 | 5/2003 | Shen et al. |
| 6,570,190 B2 | 5/2003 | Krames |
| 6,573,537 B1 | 6/2003 | Steigerwald et al. |
| 6,576,488 B2 | 6/2003 | Collins, III et al. |
| 6,576,932 B2 | 6/2003 | Khare et al. |
| D477,579 S | 7/2003 | Suenaga |
| D477,580 S | 7/2003 | Kamada |
| 6,598,998 B2 | 7/2003 | West |
| D478,877 S | 8/2003 | Hoshiba |
| 6,603,243 B2 | 8/2003 | Parkyn et al. |
| 6,603,258 B1 | 8/2003 | Mueller-Mach et al. |
| 6,608,330 B1 | 8/2003 | Yamada |
| 6,610,598 B2 | 8/2003 | Chen |
| 6,620,643 B1 | 9/2003 | Koike et al. |
| 6,623,142 B1 | 9/2003 | Lippmann et al. |
| 6,630,689 B2 | 10/2003 | Bhat et al. |
| 6,630,691 B1 | 10/2003 | Mueller-Mach et al. |
| 6,630,692 B2 | 10/2003 | Goetz et al. |
| 6,635,503 B2 | 10/2003 | Andrews et al. |
| 6,635,904 B2 | 10/2003 | Goetz et al. |
| 6,637,921 B2 | 10/2003 | Coushaine |
| 6,639,733 B2 | 10/2003 | Minano |
| D482,337 S | 11/2003 | Kamada |
| D482,666 S | 11/2003 | Kamada |
| 6,642,618 B2 | 11/2003 | Yagi et al. |
| 6,642,652 B2 | 11/2003 | Collins, III et al. |
| 6,649,440 B1 | 11/2003 | Krames et al. |
| 6,649,943 B2 | 11/2003 | Shibata et al. |
| 6,649,946 B2 | 11/2003 | Bogner et al. |
| 6,650,044 B1 | 11/2003 | Lowery |
| 6,657,236 B1 | 12/2003 | Thibeault |
| 6,657,300 B2 | 12/2003 | Goetz et al. |
| 6,664,560 B2 | 12/2003 | Emerson et al. |
| 6,671,452 B2 | 12/2003 | Winston |
| 6,679,621 B2 | 1/2004 | West et al. |
| 6,680,490 B2 | 1/2004 | Yasukawa et al. |
| 6,680,569 B2 | 1/2004 | Mueller-Mach et al. |
| 6,682,207 B2 | 1/2004 | Weber et al. |
| 6,682,331 B1 | 1/2004 | Peh |
| 6,683,327 B2 | 1/2004 | Krames et al. |
| 6,686,691 B1 | 2/2004 | Mueller et al. |
| 6,696,703 B2 | 2/2004 | Mueller-Mach et al. |
| 6,711,200 B1 | 3/2004 | Scherer |
| 6,717,353 B1 | 4/2004 | Mueller et al. |
| 6,717,355 B2 | 4/2004 | Takahashi et al. |
| D489,690 S | 5/2004 | Ishida |
| D490,387 S | 5/2004 | Yagi |
| 6,730,939 B2 | 5/2004 | Eisert et al. |
| 6,730,940 B1 | 5/2004 | Steranka |
| 6,734,467 B2 | 5/2004 | Schlereth et al. |
| 6,737,681 B2 | 5/2004 | Koda |
| 6,738,175 B2 | 5/2004 | Morita et al. |
| 6,740,906 B2 | 5/2004 | Slater, Jr. et al. |
| D490,782 S | 6/2004 | Suenaga |

| | | | |
|---|---|---|---|
| D490,784 S | 6/2004 | Ishida | |
| D491,538 S | 6/2004 | Ishida | |
| D491,899 S | 6/2004 | Yagi | |
| 6,744,071 B2 | 6/2004 | Sano et al. | |
| 6,744,077 B2 | 6/2004 | Trottier et al. | |
| 6,746,124 B2 | 6/2004 | Fischer et al. | |
| 6,746,295 B2 | 6/2004 | Sorg | |
| 6,747,298 B2 | 6/2004 | Slater, Jr. et al. | |
| 6,759,803 B2 | 7/2004 | Sorg | |
| 6,764,932 B2 | 7/2004 | Kong et al. | |
| 6,768,136 B2 | 7/2004 | Eisert et al. | |
| 6,768,525 B2 | 7/2004 | Paolini | |
| 6,774,405 B2 | 8/2004 | Yasukawa et al. | |
| 6,777,871 B2 | 8/2004 | Duggal | |
| 6,784,027 B2 | 8/2004 | Streubel et al. | |
| D495,822 S | 9/2004 | Yoneda | |
| D496,007 S | 9/2004 | Hoshiba | |
| 6,791,103 B2 | 9/2004 | Nakamura et al. | |
| 6,791,116 B2 | 9/2004 | Takahashi et al. | |
| 6,791,119 B2 | 9/2004 | Slater | |
| 6,794,211 B2 | 9/2004 | Oh | |
| 6,794,684 B2 | 9/2004 | Slater, Jr. et al. | |
| 6,794,690 B2 | 9/2004 | Uemura | |
| D497,349 S | 10/2004 | Hoshiba | |
| 6,800,500 B2 | 10/2004 | Coman | |
| 6,800,876 B2 | 10/2004 | Edmond et al. | |
| 6,806,571 B2 | 10/2004 | Shibata et al. | |
| 6,812,053 B1 | 11/2004 | Kong et al. | |
| 6,812,500 B2 | 11/2004 | Reeh et al. | |
| 6,814,470 B2 | 11/2004 | Rizkin et al. | |
| 6,819,505 B1 | 11/2004 | Cassarly | |
| 6,819,506 B1 | 11/2004 | Taylor | |
| 6,821,804 B2 | 11/2004 | Thibeault | |
| 6,825,501 B2 | 11/2004 | Edmond et al. | |
| D499,384 S | 12/2004 | Kamada | |
| D499,385 S | 12/2004 | Ishida | |
| 6,828,596 B2 | 12/2004 | Steigerwald et al. | |
| 6,828,599 B2 | 12/2004 | Kim | |
| 6,831,302 B2 | 12/2004 | Erchak | |
| 6,831,305 B2 | 12/2004 | Yasukawa et al. | |
| 6,833,564 B2 | 12/2004 | Shen et al. | |
| 6,835,957 B2 | 12/2004 | Stockman | |
| 6,838,705 B1 | 1/2005 | Tanizawa et al. | |
| 6,841,931 B2 | 1/2005 | Takahashi et al. | |
| 6,844,565 B2 | 1/2005 | Lell et al. | |
| 6,844,903 B2 | 1/2005 | Mueller-Mach et al. | |
| 6,846,101 B2 | 1/2005 | Coushaine | |
| 6,847,057 B1 | 1/2005 | Gardner et al. | |
| 6,850,002 B2 | 2/2005 | Danielson et al. | |
| 6,853,010 B2 | 2/2005 | Slater | |
| D502,449 S | 3/2005 | Ishida | |
| D503,388 S | 3/2005 | Ishida | |
| 6,870,191 B2 | 3/2005 | Niki et al. | |
| 6,870,311 B2 | 3/2005 | Mueller et al. | |
| 6,871,982 B2 | 3/2005 | Holman | |
| 6,872,986 B2 | 3/2005 | Fukuda et al. | |
| 6,876,008 B2 | 4/2005 | Bhat et al. | |
| 6,876,009 B2 | 4/2005 | Narukawa et al. | |
| 6,877,558 B2 | 4/2005 | Connell et al. | |
| 6,878,973 B2 | 4/2005 | Lowery et al. | |
| 6,885,033 B2 | 4/2005 | Andrews | |
| 6,885,036 B2 | 4/2005 | Tarsa | |
| 6,888,997 B2 | 5/2005 | Duong | |
| 6,890,085 B2 | 5/2005 | Hacker | |
| 6,891,199 B2 | 5/2005 | Baur et al. | |
| 6,896,381 B2 | 5/2005 | Benitez | |
| 6,897,488 B2 | 5/2005 | Baur et al. | |
| 6,897,490 B2 | 5/2005 | Brunner et al. | |
| 6,900,472 B2 | 5/2005 | Kondoh et al. | |
| 6,900,474 B2 | 5/2005 | Misra et al. | |
| D506,449 S | 6/2005 | Hoshiba | |
| 6,903,376 B2 | 6/2005 | Shen et al. | |
| 6,906,352 B2 | 6/2005 | Edmond et al. | |
| 6,911,676 B2 | 6/2005 | Yoo | |
| 6,916,748 B2 | 7/2005 | Huang | |
| 6,917,059 B2 | 7/2005 | Uemura | |
| 6,921,928 B2 | 7/2005 | Sonobe | |
| 6,924,514 B2 | 8/2005 | Suenaga | |
| 6,924,596 B2 | 8/2005 | Sato et al. | |
| 6,925,100 B2 | 8/2005 | Senda et al. | |
| 6,936,859 B1 | 8/2005 | Uemura et al. | |
| 6,936,860 B2 | 8/2005 | Sung et al. | |
| 6,943,128 B2 | 9/2005 | Chiyo et al. | |
| 6,943,380 B2 | 9/2005 | Ota et al. | |
| 6,943,381 B2 | 9/2005 | Gardner et al. | |
| 6,943,433 B2 | 9/2005 | Kamada | |
| 6,946,682 B2 | 9/2005 | Slater, Jr. et al. | |
| 6,946,685 B1 | 9/2005 | Steigerwald et al. | |
| D510,913 S | 10/2005 | Sumitani | |
| 6,952,024 B2 | 10/2005 | Edmond et al. | |
| 6,953,952 B2 | 10/2005 | Asakawa | |
| 6,955,933 B2 | 10/2005 | Bour et al. | |
| 6,956,245 B2 | 10/2005 | Senda et al. | |
| 6,956,247 B1 | 10/2005 | Stockman | |
| 6,958,497 B2 | 10/2005 | Emerson et al. | |
| 6,960,878 B2 | 11/2005 | Sakano et al. | |
| 6,967,116 B2 | 11/2005 | Negley | |
| 6,969,946 B2 | 11/2005 | Steranka | |
| 6,972,438 B2 | 12/2005 | Li | |
| 6,977,396 B2 | 12/2005 | Shen et al. | |
| 6,987,281 B2 | 1/2006 | Edmond et al. | |
| 6,987,287 B2 | 1/2006 | Liu et al. | |
| 6,987,613 B2 | 1/2006 | Pocius | |
| 6,989,555 B2 | 1/2006 | Goetz et al. | |
| 6,992,334 B1 | 1/2006 | Wierer, Jr. et al. | |
| 6,993,242 B2 | 1/2006 | Winston | |
| 6,995,032 B2 | 2/2006 | Bruhns et al. | |
| 6,998,771 B2 | 2/2006 | Debray et al. | |
| 7,001,058 B2 | 2/2006 | Inditsky | |
| 7,002,291 B2 | 2/2006 | Ellens et al. | |
| 7,005,679 B2 | 2/2006 | Tarsa et al. | |
| 7,005,681 B2 | 2/2006 | Bader et al. | |
| 7,005,684 B2 | 2/2006 | Uemura et al. | |
| 7,009,008 B1 | 3/2006 | Hohn et al. | |
| 7,009,199 B2 | 3/2006 | Hall | |
| 7,009,213 B2 | 3/2006 | Camras | |
| 7,009,218 B2 | 3/2006 | Sugimoto et al. | |
| 7,012,279 B2 | 3/2006 | Wierer Jr. et al. | |
| 7,012,281 B2 | 3/2006 | Tsai et al. | |
| 7,015,054 B2 | 3/2006 | Steigerwald et al. | |
| 7,015,513 B2 | 3/2006 | Hsieh | |
| 7,015,516 B2 | 3/2006 | Eliashevich | |
| 7,018,915 B2 | 3/2006 | Shibata et al. | |
| 7,021,797 B2 | 4/2006 | Minano | |
| 7,026,653 B2 | 4/2006 | Sun | |
| 7,029,935 B2 | 4/2006 | Negley et al. | |
| 7,029,939 B2 | 4/2006 | Chiyo et al. | |
| 7,030,423 B2 | 4/2006 | Chang et al. | |
| 7,037,741 B2 | 5/2006 | Tasi et al. | |
| 7,038,246 B2 | 5/2006 | Uemura | |
| 7,038,370 B2 | 5/2006 | Mueller-Mach et al. | |
| 7,040,774 B2 | 5/2006 | Beeson | |
| 7,042,012 B2 | 5/2006 | Senda et al. | |
| 7,042,153 B2 | 5/2006 | Uemura | |
| 7,045,956 B2 | 5/2006 | Braune et al. | |
| 7,053,417 B2 | 5/2006 | Kim | |
| 7,053,419 B1 | 5/2006 | Camras | |
| 7,063,807 B2 | 6/2006 | Kummer et al. | |
| 7,064,353 B2 | 6/2006 | Bhat | |
| 7,064,355 B2 | 6/2006 | Camras | |
| 7,064,480 B2 | 6/2006 | Bokor et al. | |
| 7,070,300 B2 | 7/2006 | Harbers et al. | |
| 7,071,494 B2 | 7/2006 | Steigerwald | |
| 7,071,495 B2 | 7/2006 | Uemura | |
| 7,072,096 B2 | 7/2006 | Holman | |
| 7,074,631 B2 | 7/2006 | Erchak | |
| 7,075,610 B2 | 7/2006 | Scalora | |
| 7,078,254 B2 | 7/2006 | Loh | |
| 7,078,732 B1 | 7/2006 | Reeh et al. | |
| 7,078,738 B2 | 7/2006 | Nawashiro et al. | |
| 7,080,932 B2 | 7/2006 | Keuper | |
| 7,083,993 B2 | 8/2006 | Erchak | |
| 7,087,738 B2 | 8/2006 | Botstein et al. | |
| 7,087,931 B2 | 8/2006 | Wu et al. | |
| 7,087,936 B2 | 8/2006 | Negley | |
| 7,091,656 B2 | 8/2006 | Murazaki et al. | |
| 7,095,765 B2 | 8/2006 | Liu et al. | |
| 7,098,588 B2 | 8/2006 | Jager et al. | |

| | | |
|---|---|---|
| 7,105,857 B2 | 9/2006 | Nagahama et al. |
| 7,106,090 B2 | 9/2006 | Harle et al. |
| 7,108,386 B2 | 9/2006 | Jacobson |
| 7,109,521 B2 | 9/2006 | Hallin |
| 7,109,529 B2 | 9/2006 | Uemura et al. |
| 7,111,964 B2 | 9/2006 | Suehiro et al. |
| 7,112,636 B2 | 9/2006 | Okada |
| 7,122,839 B2 | 10/2006 | Shen et al. |
| 7,132,695 B2 | 11/2006 | Ou et al. |
| 7,132,786 B1 | 11/2006 | Debray et al. |
| 7,138,662 B2 | 11/2006 | Uemura |
| 7,153,015 B2 | 12/2006 | Brukilacchio |
| 7,154,121 B2 | 12/2006 | Hsieh et al. |
| 7,154,149 B2 | 12/2006 | Wu et al. |
| D534,505 S | 1/2007 | Kamada |
| 7,157,294 B2 | 1/2007 | Uemura et al. |
| 7,161,187 B2 | 1/2007 | Suehiro et al. |
| 7,161,301 B2 | 1/2007 | Hsieh et al. |
| 7,170,097 B2 | 1/2007 | Edmond et al. |
| D536,672 S | 2/2007 | Asakawa |
| D537,047 S | 2/2007 | Asakawa |
| 7,183,586 B2 | 2/2007 | Ichihara et al. |
| 7,183,632 B2 | 2/2007 | Arndt et al. |
| 7,183,661 B2 | 2/2007 | Bogner et al. |
| 7,192,797 B2 | 3/2007 | Tu et al. |
| 7,193,299 B2 | 3/2007 | Arndt et al. |
| 7,196,359 B2 | 3/2007 | Baur et al. |
| 7,201,495 B2 | 4/2007 | Epstein |
| 7,202,181 B2 | 4/2007 | Negley |
| 7,211,832 B2 | 5/2007 | Hirose |
| 7,211,833 B2 | 5/2007 | Slater, Jr et al. |
| 7,211,835 B2 | 5/2007 | Ono |
| 7,215,074 B2 | 5/2007 | Shimizu et al. |
| 7,217,583 B2 | 5/2007 | Negley et al. |
| 7,227,190 B2 | 6/2007 | Yasukawa et al. |
| 7,227,191 B2 | 6/2007 | Eberhard et al. |
| D547,736 S | 7/2007 | Kamada |
| 7,244,968 B2 | 7/2007 | Yoo |
| 7,247,257 B2 | 7/2007 | Murazaki et al. |
| 7,247,884 B2 | 7/2007 | Shibata et al. |
| 7,247,940 B2 | 7/2007 | Hofer et al. |
| 7,250,715 B2 | 7/2007 | Mueller et al. |
| 7,253,450 B2 | 8/2007 | Senda et al. |
| 7,253,451 B2 | 8/2007 | Yoo et al. |
| 7,256,428 B2 | 8/2007 | Braune et al. |
| 7,256,468 B2 | 8/2007 | Suenaga |
| 7,256,483 B2 | 8/2007 | Epler et al. |
| 7,258,816 B2 | 8/2007 | Tamaki et al. |
| 7,259,033 B2 | 8/2007 | Slater, Jr. et al. |
| 7,259,402 B2 | 8/2007 | Edmond et al. |
| 7,264,527 B2 | 9/2007 | Bawendi et al. |
| 7,265,392 B2 | 9/2007 | Hahn et al. |
| 7,268,371 B2 | 9/2007 | Krames et al. |
| 7,274,040 B2 | 9/2007 | Sun |
| 7,279,346 B2 | 10/2007 | Andrews et al. |
| 7,279,723 B2 | 10/2007 | Matsumura et al. |
| 7,279,724 B2 | 10/2007 | Collins, III et al. |
| 7,280,288 B2 | 10/2007 | Loh et al. |
| 7,282,744 B2 | 10/2007 | Flynn et al. |
| 7,288,797 B2 | 10/2007 | Deguchi et al. |
| 7,291,529 B2 | 11/2007 | Slater, Jr. et al. |
| 7,291,865 B2 | 11/2007 | Kojima et al. |
| 7,294,866 B2 | 11/2007 | Liu |
| 7,300,175 B2 | 11/2007 | Brukilacchio |
| D557,224 S | 12/2007 | Kamada |
| 7,319,247 B2 | 1/2008 | Bader et al. |
| 7,319,289 B2 | 1/2008 | Suehiro et al. |
| 7,326,583 B2 | 2/2008 | Andrews et al. |
| 7,326,967 B2 | 2/2008 | Hsieh et al. |
| 7,329,587 B2 | 2/2008 | Bruederl et al. |
| 7,329,905 B2 | 2/2008 | Ibbetson et al. |
| 7,332,365 B2 | 2/2008 | Nakamura et al. |
| 7,335,522 B2 | 2/2008 | Wang et al. |
| 7,335,920 B2 | 2/2008 | Denbaars et al. |
| 7,338,822 B2 | 3/2008 | Wu et al. |
| 7,341,878 B2 | 3/2008 | Krames et al. |
| 7,344,902 B2 | 3/2008 | Basin et al. |
| 7,345,297 B2 | 3/2008 | Yamazoe et al. |
| 7,345,313 B2 | 3/2008 | Strauss et al. |
| 7,345,413 B2 | 3/2008 | Braune et al. |
| 7,348,600 B2 | 3/2008 | Narukawa et al. |
| D565,516 S | 4/2008 | Kamada |
| 7,351,356 B2 | 4/2008 | Delsing et al. |
| 7,352,011 B2 | 4/2008 | Smits et al. |
| 7,355,209 B2 | 4/2008 | Tsai et al. |
| 7,355,210 B2 | 4/2008 | Ou et al. |
| 7,355,284 B2 | 4/2008 | Negley |
| 7,358,522 B2 | 4/2008 | Yanamoto |
| 7,358,540 B2 | 4/2008 | Hsieh et al. |
| 7,361,938 B2 | 4/2008 | Mueller et al. |
| 7,362,048 B2 | 4/2008 | Shimizu et al. |
| 7,365,369 B2 | 4/2008 | Nakamura et al. |
| 7,365,371 B2 | 4/2008 | Andrews |
| 7,368,329 B2 | 5/2008 | Waitl et al. |
| 7,372,198 B2 | 5/2008 | Negley |
| 7,375,377 B2 | 5/2008 | Baur et al. |
| D571,738 S | 6/2008 | Wall, Jr. |
| 7,382,033 B2 | 6/2008 | Roth et al. |
| 7,384,809 B2 | 6/2008 | Donofrio |
| 7,385,226 B2 | 6/2008 | Ou et al. |
| 7,387,677 B2 | 6/2008 | Dwilinski et al. |
| 7,388,232 B2 | 6/2008 | Suehiro et al. |
| 7,390,684 B2 | 6/2008 | Izuno et al. |
| D572,209 S | 7/2008 | Tokuda |
| 7,393,122 B2 * | 7/2008 | Tsuzuki et al. ............... 362/304 |
| 7,393,213 B2 | 7/2008 | Yoo et al. |
| 7,402,837 B2 | 7/2008 | Slater, Jr. et al. |
| 7,402,840 B2 | 7/2008 | Krames et al. |
| 7,405,093 B2 * | 7/2008 | Andrews ........................ 438/26 |
| 7,414,269 B2 * | 8/2008 | Grotsch et al. ................. 257/81 |
| 7,419,839 B2 | 9/2008 | Camras et al. |
| 7,429,750 B2 | 9/2008 | Suehiro et al. |
| 7,429,758 B2 | 9/2008 | Ruhnau et al. |
| D578,226 S | 10/2008 | West et al. |
| 7,432,534 B2 | 10/2008 | Yoo et al. |
| 7,432,536 B2 | 10/2008 | Slater, Jr. et al. |
| 7,432,589 B2 | 10/2008 | Yamamoto et al. |
| 7,432,642 B2 | 10/2008 | Murazaki |
| 7,432,647 B2 | 10/2008 | Nagatomi et al. |
| 7,436,002 B2 | 10/2008 | Brunner et al. |
| 7,436,066 B2 | 10/2008 | Sonobe et al. |
| 7,439,091 B2 | 10/2008 | Chen et al. |
| 7,439,609 B2 | 10/2008 | Negley |
| 7,442,254 B2 | 10/2008 | Kiyoku et al. |
| 7,442,644 B2 | 10/2008 | Nogami |
| 7,442,966 B2 | 10/2008 | Bader et al. |
| D580,380 S | 11/2008 | Tokuda |
| 7,445,354 B2 | 11/2008 | Aoki et al. |
| 7,446,343 B2 | 11/2008 | Mueller et al. |
| 7,446,344 B2 | 11/2008 | Fehrer et al. |
| 7,446,345 B2 | 11/2008 | Emerson et al. |
| 7,446,346 B2 | 11/2008 | Harle |
| 7,452,737 B2 | 11/2008 | Basin et al. |
| 7,456,499 B2 * | 11/2008 | Loh et al. ...................... 257/710 |
| D582,865 S | 12/2008 | Edmond et al. |
| D582,866 S | 12/2008 | Edmond et al. |
| 7,462,861 B2 | 12/2008 | Slater, Jr. et al. |
| 7,473,933 B2 | 1/2009 | Yan |
| 7,528,422 B2 * | 5/2009 | Murphy ........................ 257/99 |
| 7,772,604 B2 | 8/2010 | Duong et al. |
| 7,789,531 B2 | 9/2010 | Duong et al. |
| 7,829,358 B2 | 11/2010 | Duong et al. |
| 2002/0012247 A1 | 1/2002 | Kamiya et al. |
| 2002/0017844 A1 | 2/2002 | Parkyn et al. |
| 2002/0080615 A1 | 6/2002 | Marshall et al. |
| 2002/0080622 A1 | 6/2002 | Pashley et al. |
| 2002/0123164 A1 | 9/2002 | Slater et al. |
| 2002/0127864 A1 | 9/2002 | Smith et al. |
| 2002/0141006 A1 | 10/2002 | Pocius et al. |
| 2002/0163808 A1 | 11/2002 | West et al. |
| 2003/0002272 A1 | 1/2003 | Suehiro et al. |
| 2003/0036217 A1 | 2/2003 | Richard |
| 2003/0089914 A1 | 5/2003 | Chen |
| 2003/0132447 A1 | 7/2003 | Yukimoto |
| 2003/0156416 A1 | 8/2003 | Stopa et al. |
| 2004/0016718 A1 | 1/2004 | Hwu et al. |
| 2004/0036080 A1 | 2/2004 | Bogner et al. |
| 2004/0046489 A1 | 3/2004 | Vetorino et al. |

| | | |
|---|---|---|
| 2004/0079957 A1 | 4/2004 | Andrews et al. |
| 2004/0114393 A1 | 6/2004 | Galli |
| 2004/0119083 A1 | 6/2004 | Su et al. |
| 2004/0120153 A1 | 6/2004 | Pate |
| 2004/0126913 A1 | 7/2004 | Loh |
| 2004/0155565 A1 | 8/2004 | Holder et al. |
| 2004/0201987 A1 | 10/2004 | Omata |
| 2004/0207774 A1 | 10/2004 | Gothard |
| 2004/0218390 A1 | 11/2004 | Holman et al. |
| 2004/0222426 A1 | 11/2004 | Hsiung |
| 2004/0232825 A1 | 11/2004 | Sorg |
| 2004/0233665 A1 | 11/2004 | West et al. |
| 2004/0264185 A1 | 12/2004 | Grotsch et al. |
| 2005/0001230 A1 | 1/2005 | Takekuma |
| 2005/0006651 A1 | 1/2005 | LeBoeuf et al. |
| 2005/0007777 A1 | 1/2005 | Klipstein et al. |
| 2005/0018248 A1 | 1/2005 | Silverbrook |
| 2005/0023548 A1 | 2/2005 | Bhat et al. |
| 2005/0024887 A1 | 2/2005 | Boxler |
| 2005/0047729 A1 | 3/2005 | Vilgiate |
| 2005/0063181 A1 | 3/2005 | Chiba et al. |
| 2005/0073840 A1 | 4/2005 | Chou et al. |
| 2005/0073849 A1 | 4/2005 | Rhoads et al. |
| 2005/0077529 A1 | 4/2005 | Shen |
| 2005/0173719 A1 | 8/2005 | Yonekubo |
| 2005/0195488 A1 | 9/2005 | McCabe et al. |
| 2005/0215000 A1 | 9/2005 | Negley |
| 2005/0274970 A1 | 12/2005 | Ludowise |
| 2006/0046622 A1 | 3/2006 | Prasad |
| 2006/0094340 A1 | 5/2006 | Ouderkirk et al. |
| 2006/0108590 A1 | 5/2006 | Kawaguchi |
| 2006/0192194 A1 | 8/2006 | Erchak et al. |
| 2007/0018181 A1 | 1/2007 | Steen et al. |
| 2007/0108459 A1 | 5/2007 | Lu |
| 2007/0152230 A1 | 7/2007 | Duong et al. |
| 2008/0030974 A1 | 2/2008 | Abug-Ageel |
| 2008/0030993 A1 | 2/2008 | Narendran et al. |
| 2008/0049445 A1 | 2/2008 | Harbers et al. |
| 2008/0062672 A1 | 3/2008 | Peng et al. |
| 2008/0080166 A1 | 4/2008 | Duong et al. |
| 2008/0081531 A1 | 4/2008 | Duong et al. |
| 2008/0266893 A1 | 10/2008 | Speier |
| 2009/0085043 A1 | 4/2009 | Song et al. |
| 2009/0085052 A1 | 4/2009 | Ko et al. |
| 2009/0087937 A1 | 4/2009 | Kim |
| 2009/0087994 A1 | 4/2009 | Lee et al. |

FOREIGN PATENT DOCUMENTS

| | | |
|---|---|---|
| EP | 1380469 A2 | 1/2004 |
| JP | P3900144 | 4/1997 |
| JP | 200353647 | 2/2003 |
| WO | WO2007061638 | 5/2007 |
| WO | WO2007081719 A2 | 7/2007 |
| WO | WO2008042351 A3 | 4/2008 |

OTHER PUBLICATIONS

ISR/WO issued in PCT Application No. PCT/US07/00102 mailed Mar. 28, 2008, 10 pgs.
ISR/WO issued in PCT Application No. PCT/US07/21117 mailed Mar. 25, 2008, 10 pgs.
International Preliminary Report on Patentability for PCT Application No. PCT/US2007/00102, mailed Jul. 17, 2008, 7 pgs.
Light-Emitting Diode, Wikipedia, Nov. 17, 2008, pp. 1-15, at http://en.wikipedia.org/wiki/Light-emitting_diode.
Cree XLamp LED Reliability, Cree LED Light, Sep. 2007, pp. 1-9, Cree, Inc., Durham, NC 27703, at www.cree.com/xlamp.
Golden DRAGON Engineering Kit, OSRAM Opto Semiconductors GmbH, Oct. 4, 2006, Regensburg, Germany, at www.osram-os.com.
Power Light Source Luxeon Rebel, Technical Datasheet DS56, Philips, Jul. 2008, Philips Lumileds Lighting Company, US, at www.luxeon.com.
Specification for NICHIA Chip Type White LED, Model NSSW108T, Cat. No. 070606, Undated, pp. 1-12, NICHIA Corporation.
Haque, High-power LED Stud-bump Packaging, Advanced Packaging, Apr. 2006, pp. 1-6, at http://ap.pennnet.com/Articles/Article_Display.cfm?Section+Artcl&Article_ID=252 779&VERSI.
Wong et al., Packaging of Power LEDS Using Thermosonic Bonding of Au-Au Interconnects, SMTA Int'l Conf., Sep. 24, 2006, pp. 1-2, SMTA, Edina, MN at www.smta.org.
Moreno, LED Intensity Distribution, International Optical Design Conf. 2006, Jun. 2006, Optical Society of America, ISBN: 1-55752-814-4.
Moreno et al., Modeling the Radiation Pattern of LEDs, Optics Express, Feb. 4, 2008, vol. 16, No. 3, Optical Society of America #90469s.
Cho et al., Dry etching of GaN and related materials; Comparison of techniques, IEEE Journal of Selected Topics in Quantum Electronics, 1998, 4(3):557-563.
Mishra, Gan Vacuum Microelectronic Electron Emitter with Integrated Extractor, Santa Barbara CA, Jan. 28, 2009 @ my.ece.ucsb.edu/mishra/vacuummicroelec/finalrepnsf.pdf.
He et al., GaN layers re-grown on etched GaN templates by plasma assisted molecular beam epitaxy, Mat. Res. Soc. Symp. vol. 798, 2004 Materials Research Society, Richmond, VA.
Gallium Nitride Film Growth, downloaded Feb. 6, 2009 at www.onr.navy.mil/sci_tech/31/312/ncsr/materials/gan/filmgrowth.asp?css printer&.
The Asymmetric Reflector, Elliptipar, West Haven, CT, 2 pages, downloaded from http://www.elliptipar.com/reflector.asp on Mar. 27, 2009.
Sports Lighting Solutions-Lighting Information, Abacus Lighting Limited, Nottinghamshire, England, 3 pages, downloaded from http://www.abacuslighting.com/sportslighting.asp?sport=sn03 on Mar. 27, 2009.
Samsung files patents ahead of LED spin-out, Apr. 2, 2009, downloaded Apr. 14, 2009 at http://compoundsemiconductor.net/cws/article/news/38551, 2 pages.
International Search Report and Written Opinion issued in PCT Application No. PCT/US09/033429 dated Apr. 15, 2009, 9 pgs.
International Preliminary Report on Patentability issued in PCT Application No. PCT/US07/021117 dated Apr. 7, 2009, 8 pgs.
Office Action issued in U.S. Application No. 11/906,194, mailed on Jul. 24, 2009, Duong, 6 pgs.
International Search Report and Written Opinion issued in PCT Application No. PCT/US09/48788, mailed Aug. 14, 2009, 7 pgs.
International Search Report and Written Opinion issued in PCT Application No. PCT/US09/48787, mailed Aug. 19, 2009, 7 pgs.
Office Action issued in U.S. Application No. 11/649,018, mailed on Sep. 4, 2009, 18 pgs.
International Search Report and Written Opinion issued in PCT Application No. PCT/US09/051962, mailed Sep. 15, 2009, 5 pgs.
Office Action issued in U.S. Application No. 11/906,219 mailed on May 13, 2010, 13 pgs.
Notice of Allowance for U.S. Patent Application No. 11/906,219, mailed Oct. 12, 2010, 6 pgs.
International Search Report and Written Opinion for PCT Application No. PCT/US2010/046108, mailed Oct. 18, 2010, 7 pgs.
European Search Report and Written Opinion for Application No. EP 07716261, mailed Nov. 30, 2010, 8 pgs.
Office Action issued in U.S. Appl. No. 11/906,219 mailed Jan. 18, 2011, 11 pgs.
International Preliminary Report on Patentability for PCT Application No. PCT/US2009/048787 mailed Jan. 13, 2011, 7 pgs.
International Preliminary Report on Patentability for PCT Application No. PCT/US2009/048788 mailed Jan. 13, 2011, 6 pgs.
Notice of Allowance for U.S. Appl. No. 12/788,094, mailed May 3, 2011, 11 pgs.
Office Action for U.S. Appl. No. 11/906,219, mailed May 24, 2011, 13 pgs.
International Preliminary Report on Patentability issued in PCT Application No. PCT/US2009/067701, mailed Jun. 23, 2011, 7 pgs.

* cited by examiner

SYSTEMS AND METHODS FOR PACKAGING LIGHT-EMITTING DIODE DEVICES

CROSS-REFERENCE TO RELATED APPLICATIONS

This is a conversion of and claims priority from U.S. Provisional Application No. 61/121,874, filed Dec. 11, 2008, entitled "SYSTEMS AND METHODS FOR PACKAGING LIGHT-EMITTING DIODE DEVICES" and U.S. Provisional Application No. 61/121,870, filed Dec. 11, 2008, entitled "SYSTEMS AND METHODS FOR PACKAGING WHITE LIGHT-EMITTING DIODE DEVICES," the contents of which are fully incorporated by reference herein for all purposes. The present application also relates to U.S. patent application Ser. No. 11/906,194, filed Oct. 1, 2007, entitled "LED SYSTEM AND METHOD" and U.S. patent application Ser. No. 11/906,219, filed Oct. 1, 2007, entitled "LED SYSTEM AND METHOD," both of which are hereby incorporated by reference herein.

FIELD OF THE DISCLOSURE

The present disclosure relates generally to light-emitting diode (LED) devices and, more particularly, to systems and methods for packaging LED devices to provide light with the maximum possible overall system brightness and efficiency.

BACKGROUND

Light emitting diodes ("LEDs") are ubiquitous in electronics. They are used in digital displays, lighting systems, computers and televisions, cellular telephones and a variety of other devices. Developments in LED technology have led to methods and systems for the generation of white light using one or more LEDs. Developments in LED technology have also led to LEDs that generate more photons and thus more light than previously. The culmination of these two technological developments is that LEDs are being used to supplement or replace many conventional lighting sources such as incandescent, fluorescent or halogen bulbs, much as the transistor replaced the vacuum tube in computers.

LEDs can be produced in a number of colors, including red, green, and blue. One method of generating white light involves the use of red, green, and blue LEDs in combination with one another. A lighting source that is made of combinations of red, green and blue (RGB) LEDs will produce what is perceived as white light by the human eye. This occurs because the human eye has three types of color receptors, with each type sensitive to either blue, green, or red colors.

A second method of producing white light from LED sources is to create light from a single-color (e.g. blue), short wavelength LED, and impinge a portion of that light onto phosphor or a similar photon conversion material. The phosphor absorbs the higher energy, short wavelength light waves, and re-emits lower energy, longer wavelength light. If a phosphor is chosen that emits light in the yellow region (between green and red), for example, the human eye perceives such light as white light. This occurs because the yellow light stimulates both the red and green receptors in the eye. Other materials, such as nano-particles or other similar photo-luminescent materials, may be used to generate white light in much the same way.

Additionally, white light may be generated utilizing an ultraviolet (UV) LED and three separate RGB phosphors. White light may be generated from a blue LED and a yellow LED. White light may also be generated utilizing blue, green, yellow, and red LEDs in combination.

Current industry practice for construction of LEDs is to use a substrate (typically either single-crystal Sapphire or Silicon Carbide), onto which is deposited layers of materials such as GaN or InGaN. One or more layers (e.g., GaN or InGaN) may allow photon generation and current conduction. Typically, a first layer of Gallium Nitride (GaN) is applied to the surface of the substrate to form a transition region from the crystal structure of the substrate to the crystal structure of doped layers allowing for photon generation or current conduction. This is typically followed by an n-doped layer of GaN. The next layer can be an InGaN, AlGaN, AlInGaN or other compound semiconductor material layer that generates photons and that is doped with the needed materials to produce the desired wavelength of light. The next layer is typically a P doped layer of GaN. This structure is further modified by etching and deposition to create metallic sites for electrical connections to the device.

During the operation of an LED, as in a traditional diode, extra electrons move from an n-type semiconductor to electron holes in a p-type semiconductor. In an LED, photons are released in the compound semiconductor layer to produce light during this process.

In a typical manufacturing process, the substrate is fabricated in wafer form and the layers are applied to a surface of the wafer. Once the layers are doped or etched and all the features have been defined using the various processes mentioned, the individual LEDs are separated from the wafer. The LEDs are typically square or rectangular with straight sides. This can cause significant efficiency losses and can cause the emitted light to have a poor emission pattern. A separate optical device, such as a plastic dome, is often placed over the LED to achieve a more desirable output.

SUMMARY OF THE DISCLOSURE

In many LED applications, it is desirable to maximize visible light output for a given power input, a quantity often expressed in lumens per watt (lm/W) for white light, or milliwatts per watt (mW/W) for shorter wavelength light such as blue. Existing LED technologies may attempt to increase this ratio, typically referred to as "overall efficiency" or "wall-plug efficiency." However, existing LED technologies still suffer poor overall efficiency and low extraction efficiency. Packaging is one factor that affects the overall system brightness and efficiency.

For a given flux and emission angle, the size of a packaged LED essentially defines the LED's brightness. Within this disclosure, the term "brightness" may refer to the power of light perceived by the human eye, measurable in units of lumen. For example, if a light source emits one candela of luminous intensity uniformly across a solid angle of one steradian, its total luminous flux emitted into that angle is one lumen. Luminous flux is related to, but differs from radiant flux, the measure of the total power of light emitted. The smaller the package size, the higher the brightness. Brightness is an important characteristic of any light source. The higher the brightness, the easier it is to direct and control the light. For certain applications such as digital light processing (DLP), liquid crystal on silicon (LCOS), spot lights, etc, the light source has to be sufficiently bright to enable the technology. For other applications such as liquid crystal display (LCD) backlights, smaller LED package size translates to thinner, lighter, and more compact display systems.

In traditionally packaged LED devices such as Luxeon® Rebel and Luxeon® K2 by Philips Lumileds Lighting Company, Cree XLamp® by Cree, Inc., the Dragon® family of high power LEDs by Osram Opto Semiconductors Inc., etc., coupling side emission out of the chip requires the use of reflectors, domes or other secondary optic. This increases the package size as well as the manufacturing costs. With such large packages, the overall system brightness is reduced and thus the overall illumination system efficiency is reduced. Such an efficiency reduction results in more power usage than necessary. Today, most packaged LED chips have side emission and the industry continues to work on how to couple the side emission out of the LED package and make it useable.

Embodiments disclosed herein can be particularly suitable for packaging LED devices in which the majority of the emitted light comes out of the top of an LED chip and side emission can be negligible. This makes it possible to focus the packaging on directing the emission from the top surface of the LED chip. This also makes it possible for the LED chip to forego domes, reflectors and other secondary optics. Since such an LED chip does not need secondary optics, the LED package can remain similar in dimensions to the LED chip and keep the overall package size very small.

In some embodiments, a packaged LED may comprise a sub-mount and a housing coupled to the submount. In one embodiment, the submount and the housing may be coupled using an adhesive. In some embodiments, the housing may be shaped like a cube. Other shapes are also possible. For example, in some embodiments, the housing may be a three-dimensional structure with a top opening, a bottom opening, and three, four, five, six, or more sides between the top opening and the bottom opening. In some embodiments, the top of the housing may have a rolled edge or lip surrounding the top opening. In some embodiments, the housing may comprise an internal cavity in which an LED chip resides. In some embodiments, the housing may comprise an interior side wall. In some embodiments, the interior wall of the housing may be tapered. In some embodiments, the interior wall of the housing may have a shoulder area near the top opening of the housing.

In some embodiments, the housing may be made of a polymeric material such as plastic. In some embodiments, the exterior side wall of the housing may comprise one or more optional notches on one or more corners of the housing to facilitate lifting the housing from a mold during the manufacturing process.

In some embodiments, the submount may comprise a block of material having high thermal conductivity. In some embodiments, the submount may comprise a top surface and a bottom surface. In some embodiments, the submount may comprise metal traces, vias, or a combination thereof. In some embodiments, the submount may comprise caps on the bottom surface, metal traces on the top surface, and embedded vias connecting the caps on the bottom surface and the metal traces on the top surface.

In some embodiments, the submount and the housing may share an identical or substantially identical foot print. In some embodiments, the submount and the housing may be sized and dimensioned to accommodate a single LED chip. In some embodiments, the submount and the housing may be sized and dimensioned to accommodate an array of LED chips. Examples of an array of LED chips may include, but are not limited to, an array of four LED chips, an array of nine LED chips, an array of sixteen LED chips, an array of twenty-five LED chips, and so on. Because these LED chips do not require domes, reflectors, or other secondary optics, the size of a supporting submount for a LED chip can be minimized, depending on the housing requirement. This allows the overall package size to be very small as compared to traditional packaged LED devices.

In some embodiments, the packaged LED may further comprise an LED chip and a phosphor plate. In some embodiments, the LED chip is connected to the metal traces on the submount via gold stud bumps. In some embodiments, the phosphor plate is positioned above the LED chip inside the housing. In some embodiments, the phosphor plate rests on the shoulder area on top of the interior wall inside the housing. In some embodiments, the phosphor plate is secured to the housing by the rolled edge surrounding the top opening of the housing. In some embodiments, the phosphor plate is secured to the housing using an adhesive. In some embodiments, the LED chip and the phosphor plate is separated by an air gap and/or a low index optical coupling material. In some embodiments, the air gap also separates the LED chip and the interior wall of the housing.

In some embodiments, a method of packaging an LED device may comprise providing a supporting submount and attaching one or more LED chips to the submount. In some embodiments, the Gold-to-Gold Interconnect (GGI) process may be utilized. In some embodiments, solder-based approaches may be used to attach the LED structure or structures to the submount. One advantage of using the GGI process is the high thermal conductivity of gold.

The method may further comprise placing a housing on the supporting submount. In some embodiments, the housing can be adhered to the supporting submount utilizing an adhesive that can withstand reflow temperatures. In some embodiments, the housing is made of a plastic material that can withstand reflow temperatures.

In some embodiments, the phosphor plate and the housing are joined prior to adhesion to the submount. In some embodiments, the phosphor plate can be positioned within the housing by heat staking. In some embodiments, the phosphor plate can be positioned within the housing using an epoxy that can withstand the high temperature of reflow. In some embodiments, the phosphor plate can be positioned on top of the housing utilizing an adhesive. In some embodiments, the phosphor plate can be made of glass or a clear polymer that can withstand reflow conditions. In some embodiment, phosphor is deposited on top of an LED chip, close to or essentially on the exit face of the LED chip. This is possible because light only comes out the top surface of the LED chip. This unique technological advantage can simplify phosphor deposition and color temperature control.

These, and other, aspects of the disclosure will be better appreciated and understood when considered in conjunction with the following description and the accompanying drawings. It should be understood, however, that the following description, while indicating various embodiments of the disclosure and numerous specific details thereof, is given by way of illustration and not of limitation. Many substitutions, modifications, additions and/or rearrangements may be made within the scope of the disclosure without departing from the spirit thereof, and the disclosure includes all such substitutions, modifications, additions and/or rearrangements.

BRIEF DESCRIPTION OF THE DRAWINGS

The drawings accompanying and forming part of this specification are included to depict certain aspects of the disclosure. Skilled artisans can appreciate that features shown in the drawings are illustrated for simplicity and clarity to help facilitate understanding of embodiments disclosed herein and have not necessarily been drawn to scale. A more complete understanding of the disclosure and the advantages thereof may be acquired by referring to the following description, taken in conjunction with the accompanying drawings in which like reference numbers indicate like features and wherein.

DETAILED DESCRIPTION

Figure 1:
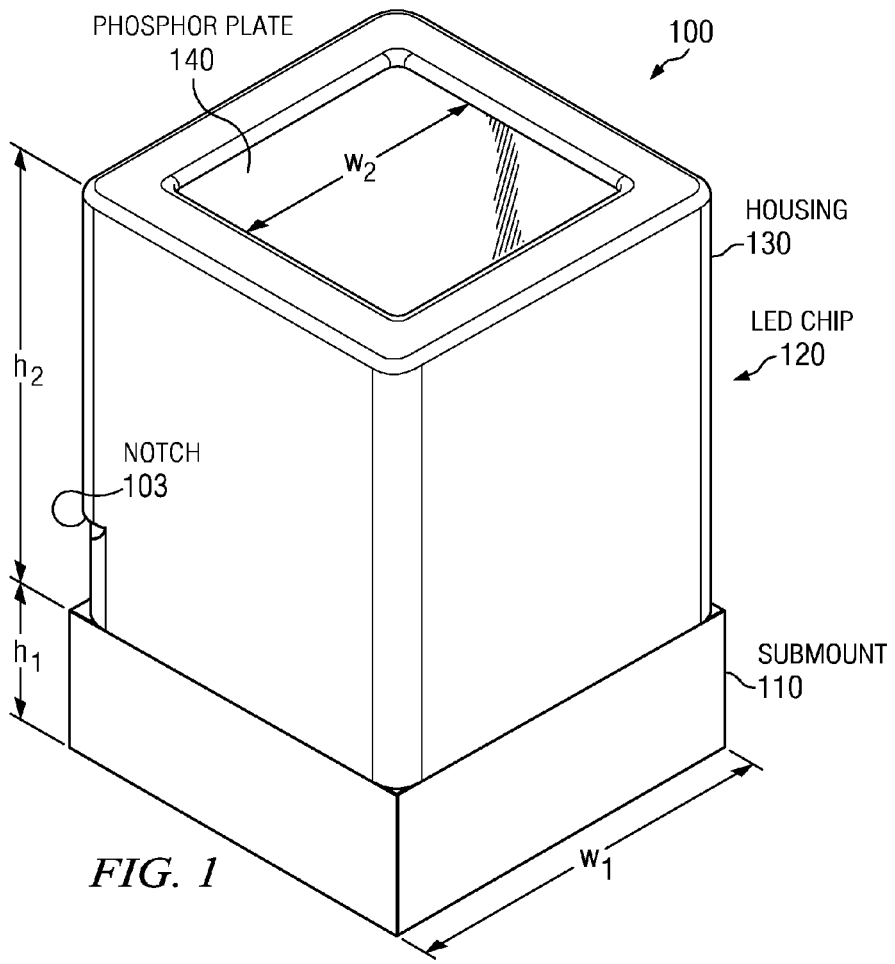
FIG. 1 is a diagrammatic representation of a perspective view of an example of one embodiment of a packaged LED having a housing positioned on a supporting submount.

The disclosure and the various features and advantageous details thereof are explained more fully with reference to the non-limiting embodiments that are illustrated in the accompanying drawings and detailed in the following description. Skilled artisans should understand, however, that the detailed description and the specific examples, while disclosing preferred embodiments, are given by way of illustration only and not by way of limitation. Various substitutions, modifications, additions or rearrangements within the scope of the underlying inventive concept(s) will become apparent to those skilled in the art after reading this disclosure.

As used herein, the terms "comprises," "comprising," "includes," "including," "has," "having" or any other variation thereof, are intended to cover a non-exclusive inclusion. For example, a process, product, article, or apparatus that comprises a list of elements is not necessarily limited only those elements but may include other elements not expressly listed or inherent to such process, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, any examples or illustrations given herein are not to be regarded in any way as restrictions on, limits to, or express definitions of, any term or terms with which they are utilized. Instead these examples or illustrations are to be regarded as being described with respect to one particular embodiment and as illustrative only. Those of ordinary skill in the art will appreciate that any term or terms with which these examples or illustrations are utilized encompass other embodiments as well as implementations and adaptations thereof which may or may not be given therewith or elsewhere in the specification and all such embodiments are intended to be included within the scope of that term or terms. Language designating such non-limiting examples and illustrations includes, but is not limited to: "for example," "for instance," "e.g.," "in one embodiment," and the like.

Embodiments disclosed herein can be particularly suitable for packaging LED devices in which the majority of the emitted light comes out of the top of a LED chip. Examples of such LED devices are described in the above-referenced U.S. patent application Ser. No. 11/906,194, filed Oct. 1, 2007, entitled "LED SYSTEM AND METHOD" and U.S. patent application Ser. No. 11/906,219, filed Oct. 1, 2007, entitled "LED SYSTEM AND METHOD." One unique aspect of this type of top-emitting LED chip (also referred to herein as an Illumitex® LED chip) is that the side emission can be negligible. For example, there might be about 6%, 3%, 1%, or 0.1% or less side emission in some embodiments of a top-emitting LED chip. This makes it possible for embodiments disclosed herein to focus on directing the light emission from the top surface of an LED chip. This also makes it possible for embodiments disclosed herein to forego domes, reflectors, and other secondary optics. Within this disclosure, the term "chip" is used as a general representation of a variety of unique Illumitex® LED implementations, some of which are described in the above-referenced U.S. Patent Applications.

FIG. 1 is a diagrammatic representation of a perspective view of an example of one embodiment of packaged LED 100 having housing 130 positioned on supporting submount 110. In some embodiments, housing 130 may be made of a polymeric material such as plastic. As further described below, other materials may also be used. In some embodiments, housing 130 may have one or more optional notch 103 located on one or more corners to facilitate lifting housing 130 from a plastic mold. Housing 130 and submount 110 may be sized and dimensioned to accommodate one or more LED chip 120. Specifically, LED chip 120 resides in a cavity, as defined by interior wall 135, inside housing 130, on top of submount 110. In this example, phosphor plate 140 is positioned on top of LED chip 120 inside housing 130.

Figure 4:
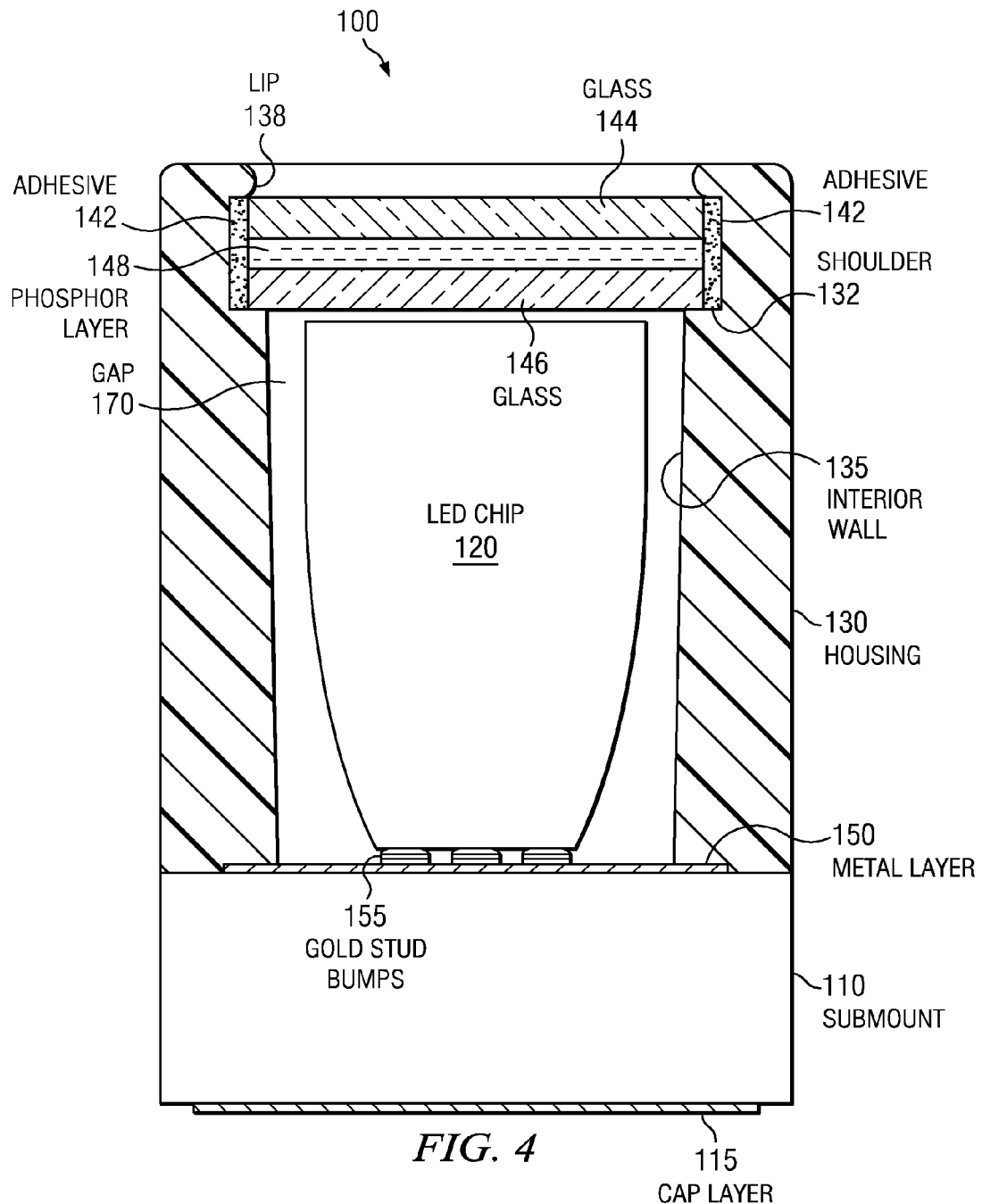
FIG. 4 is a diagrammatic representation of a cross-sectional view of a portion of the packaged LED of FIG. 1.

In one embodiment, the submount and the housing may be coupled using an adhesive. In the example of FIG. 1, housing 130 is shaped approximately like a cube. Other shapes are also possible. For example, in some embodiments, housing 130 may be a three-dimensional structure with a top opening, a bottom opening, and three, four, five, six, or more sides between the top opening and the bottom opening. In FIG. 1, the top opening is defined by width $w_2$, which is smaller than width $w_1$ that defines a footprint of packaged LED 100. Housing 130 and submount 110 may share the same or essentially the same foot print and may have different heights respectively defined by $h_2$ and $h_1$. In some embodiments, submount 110 and housing 130 may be sized and dimensioned to accommodate a single LED chip, as illustrated in FIG. 4.

As illustrated in FIG. 1, phosphor plate 140 is visible from the top opening of housing 130. Phosphor plate 140 may have a dimension that is generally larger than the top opening of housing 130. Phosphor plate 140 will be further described below with reference to FIG. 4.

Figure 2:
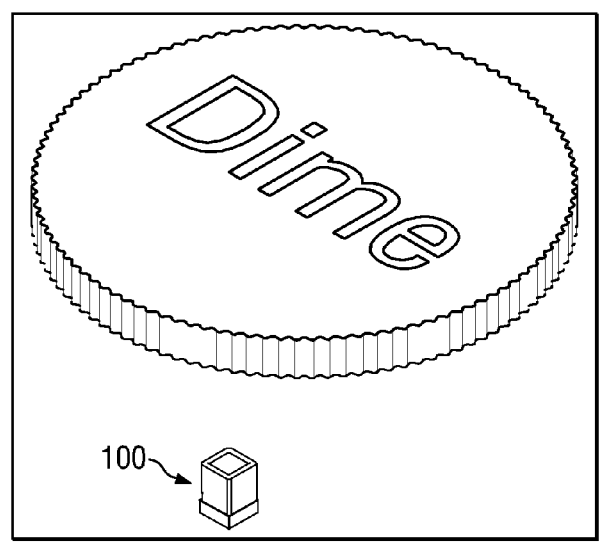
FIG. 2 is a diagrammatic representation of a U.S. coin and the packaged LED of FIG. 1.

The overall size of packaged LED 100 is generally defined by $w_1$, $h_1$, and $h_2$ and is significantly smaller than conventionally packaged LED devices. As an example, one embodiment of a packaged LED may implement an LED chip having a light emitting region of approximately 300 μm×300 μm and an exit face of approximately 531 μm×531 μm. This packaged LED can be only slightly larger than the LED chip and can be kept at approximately 1 mm cube. In this specific example, $w_1=h_1=1$ mm, $w_1<w_2$, and $h_2<h_1$. This significant size reduction in an LED package and advantages associated therewith can be put in perspective by comparing packaged LED 100 with a known object such as a dime, as illustrated in FIG. 2.

Figure 3:
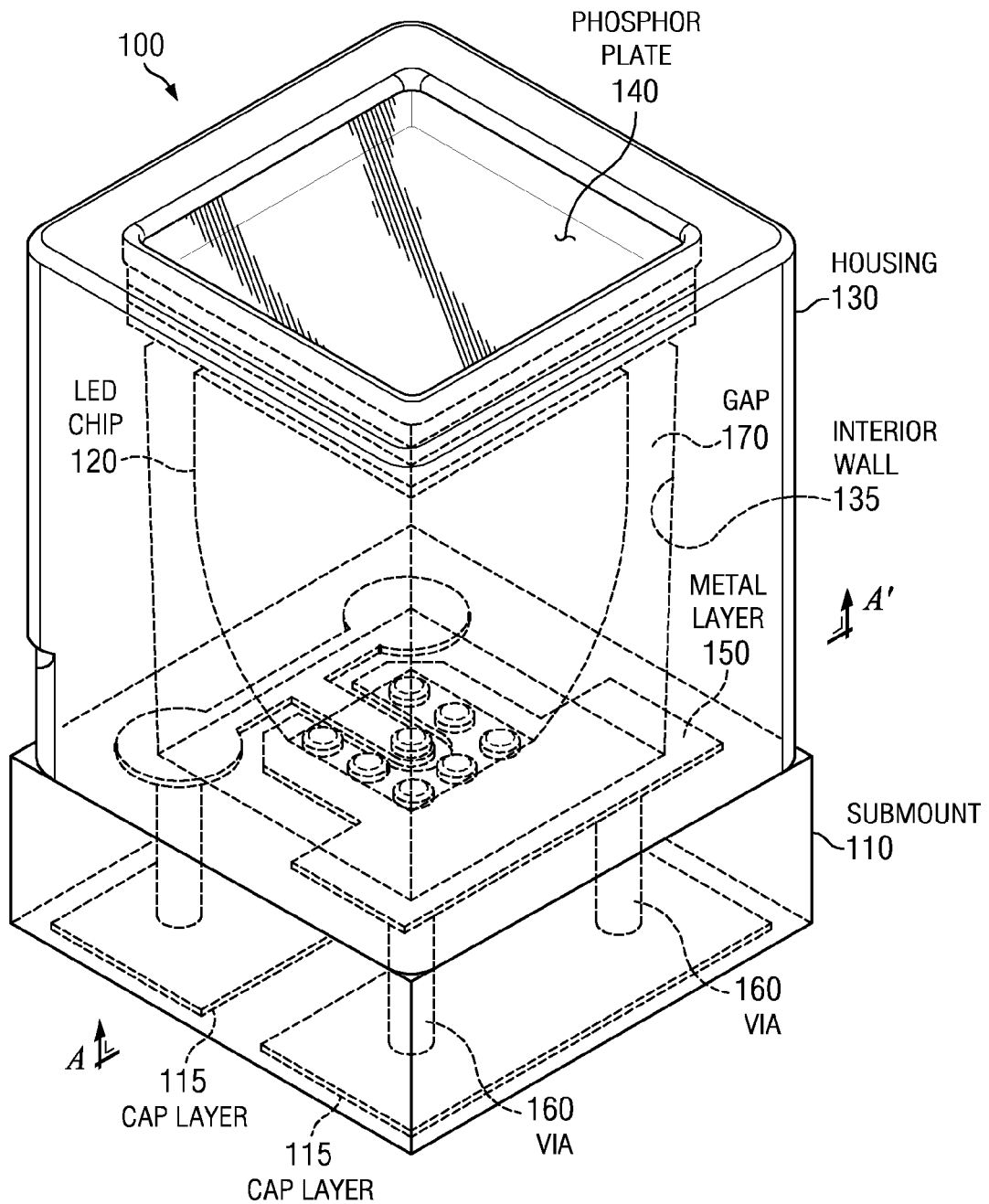
FIG. 3 is a diagrammatic representation of a transparent perspective view of a portion of the packaged LED of FIG. 1, showing a single LED chip inside a cavity of the housing and interconnect embedded in the submount.

FIG. 3 is a diagrammatic representation of a simplified, transparent perspective view of a portion of packaged LED 100. In some embodiments, housing 130 may comprise interior wall 135 defining a cavity in which LED chip 120 resides. In some embodiments, interior wall 135 of housing 130 may be tapered. In some embodiments, interior wall 135 of housing 130 may be shaped to accommodate LED chip 120. In some embodiments, interior wall 135 of housing 130 may be shaped to minimize air gap 170.

In some embodiments, housing 130 may be made of a synthetic material. Examples of suitable materials may include, but are not limited to, plastic, thermoplastic, and other types of polymeric materials. Composite materials or other engineered materials may also be used. In some embodiments, housing 130 may be made by a plastic injection molding manufacturing process. Various molding processes and other types of manufacturing processes may also be used. In some embodiments, housing 130 may be opaque. In some embodiments, housing 130 may be transparent or semi-transparent. In some embodiments, one or more layers of coating may be applied to interior wall 135 of housing 130. In some embodiments, one or more layers of coating may be applied to exterior surfaces of housing 130.

In some embodiments, submount 110 may comprise a block of thermally conductive material having a top surface and a bottom surface. Submount 110 may further comprise cap layers 115 on the bottom surface, metal layer 150 on the top surface, and embedded electrical connectors (vias) 160 extending between the top and bottom surfaces and connecting cap layer 115 and metal layer 150. Those skilled in the art can appreciate that cap layer 115 may be constructed in various ways using a variety of materials, including gold. In some embodiments, cap layer 115 may be constructed using a copper material with a thin cap thereon to improve bondability. In some embodiments, cap layer 115 may be constructed using gold, silver, nickel-gold, or other alloys.

FIG. 4 is a diagrammatic representation of a cross-sectional view, generally along line A-A' shown in FIG. 3, of a portion of packaged LED 100. In some embodiments, the top of housing 130 may have rolled edge or lip 138 surrounding the top opening (defined by $w_2$ as shown in FIG. 1) of housing 130. In some embodiments, housing 130 may have shoulder area 132 on top of interior wall 135, near the top opening of housing 130. In some embodiments, shoulder area 132 may wrap around on top of interior wall 135 inside housing 130.

In some embodiments, phosphor plate 140 is positioned above LED chip 120 inside housing 130. In addition to offering environmental protection for LED chip 120, housing 130 may also provide mechanical support for phosphor plate 140. Specifically, in some embodiments, phosphor plate 140 rests on shoulder area 132 on top of interior wall 135 of housing 130. In some embodiments, phosphor plate 140 may comprise phosphor layer 148 sandwiched between glass 144 and glass 146. Other optically transparent materials such as clear polymer may also be used to sandwich or carry phosphor layer 148. There are several ways to hold phosphor plate 140 in place. For example, lip 138 may be created utilizing rolled edge, heat-staking, deformation, and so on.

In some embodiments, phosphor plate 140 may be secured to housing 130 using adhesive 142. In some embodiments, adhesive 142 may be a thermo epoxy resin. In some embodiments, the thermo epoxy resin can withstand reflow temperatures such as 260° C. Other synthetic resins with similar thermal and adhesive properties may also be used.

In some embodiments, the housing is made of a plastic material that can withstand reflow temperatures. In some embodiments, the housing is made of a Liquid Crystal Polymer (LCP) that allows it to withstand high temperatures. Other suitable polymeric or composite materials may also be used.

In some embodiments, LED chip 120 and phosphor plate 140 is separated by air gap 170. In some embodiments, air gap 170 comprises the space between interior wall 135 and LED chip 120. In some embodiments, air gap 170 may be minimized by manipulating the shape of interior wall 135.

In keeping everything relatively small, submount 110 may be made of a material with high thermal conductivity to spread and conduct the heat produced by LED chip 120. To this extent, suitable materials may include, but are not limited to:

Low Temperature Cofire Ceramic (LTCC) with thermal vias
High Temperature Cofire Ceramic (HTCC) with thermal vias
Beryllium Oxide (BeO) ceramic
Alumina ceramic
Silicon
Aluminum Nitride (AlN)
Metal (Cu, Al, etc.)
Flex circuit LTCC and HTCC can be relatively inexpensive solutions, so long as they can meet the minimum via to via pitch requirements. BeO can be an excellent thermal conductor. Alumina ceramic can also be an inexpensive solution. Flex circuit and metal are essentially the same solutions, with metal insert molding (lead frame design) being a less expensive and high thermal conductivity solution. AlN can accommodate the fine feature size of Illumitex® LED structures and has a relatively high thermal conductivity at 170 W/mK. Silicon can also be an ideal choice—it's inexpensive, has relatively high thermal conductivity at 150 W/mK and control circuits or protection diodes can be embedded right into the substrate of the submount. Some embodiments of a packaged LED may utilize silicon, AlN, or metal as a material for the supporting submount.

The size of a supporting submount for a LED chip can be minimized depending on the housing requirement. In some embodiments, the submount may be about 1 mm×1 mm or less. With packaging improvements, further reduction may be possible.

Figure 5:
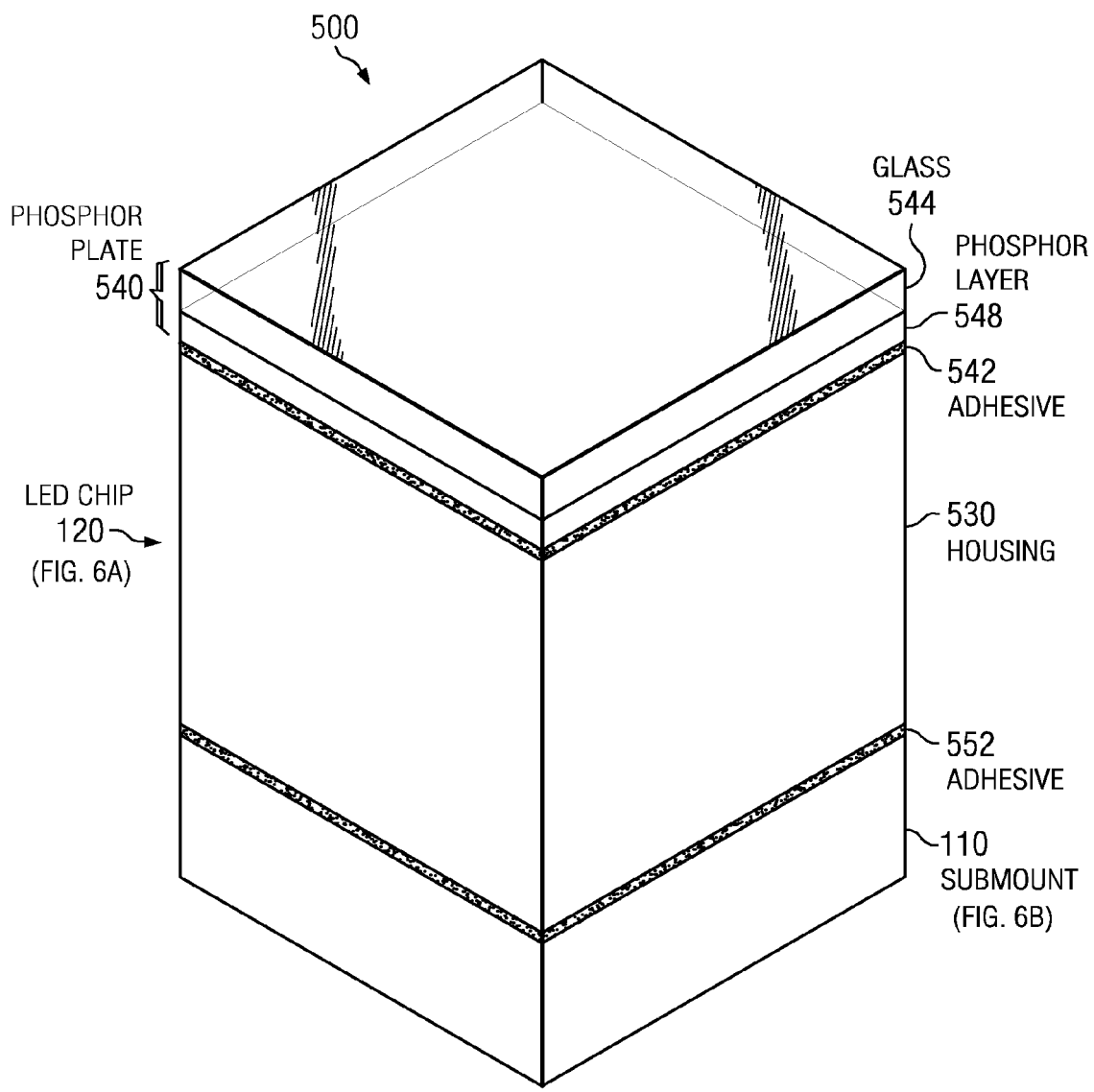
FIG. 5 is a diagrammatic representation of a perspective view of an example of one embodiment of a packaged LED having a housing positioned on a supporting submount.

FIG. 5 is a diagrammatic representation of a perspective view of an example of one embodiment of packaged LED 500 having submount 110, housing 530, and phosphor plate 540. In this example, phosphor plate 540 may be attached to housing 530 utilizing adhesive 542 and housing 530 may be attached to supporting submount 110 utilizing adhesive 552. Adhesive 542 and adhesive 552 may be the same or different. Phosphor plate 540 may comprise phosphor layer 548 and glass 544. In some embodiments, phosphor layer 548 may be created by depositing phosphor directly on top of chip 120. In some embodiments, phosphor layer 548 may be created by depositing phosphor on top of glass 544 in a separate process prior to attaching phosphor plate 540 to housing 530.

Figure 6A:
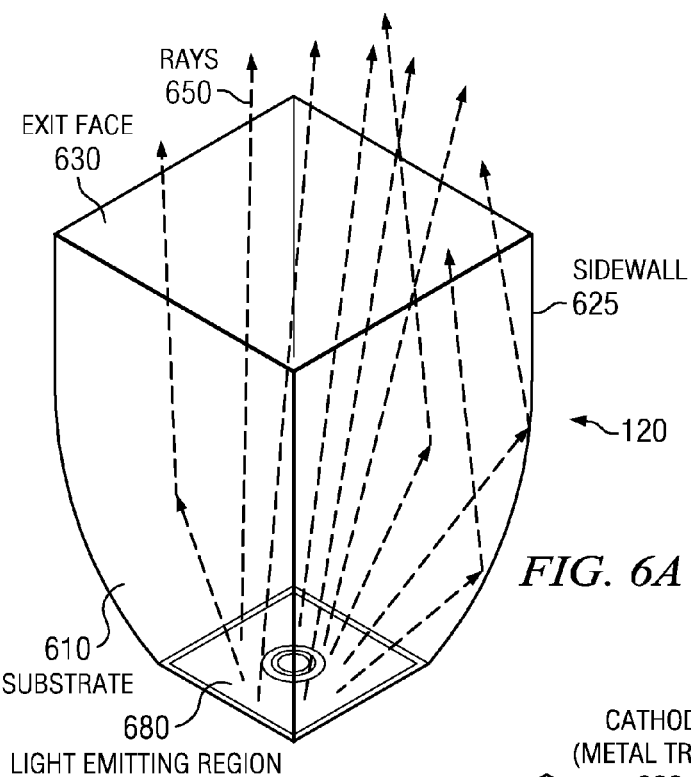
FIG. 6A is a diagrammatic representation of a perspective view of an example of one embodiment of an LED chip.

FIG. 6A is a diagrammatic representation of a perspective view of an example of one embodiment of LED chip 120. In some embodiments, LED chip 120 may comprise substrate 610 and light emitting region 680. Light emitting region 680 may comprise one or more layers or regions of doping. Examples of such a light emitting region may include a compound semiconductor such as InGaN or AlInGaP or AlGaN. Examples of a suitable LED chip substrate may include a sapphire substrate, a silicon carbide (SiC) substrate, or other substrate known or developed in the art. Photons from light emitting region 680 may enter substrate 610 through an interface there between. Light emitting region 680 and substrate 610 may form sidewall 625 that is particularly structured to conserve brightness for a desired half angle according to the conservation of radiance, allowing almost all the light to emit from exit face 630 on top of substrate 630 with negligible or almost negligible side emission, as illustrated by rays 650. Readers are directed to the above-referenced U.S. Patent Applications for further detailed description on examples of such a top-emitting LED chip.

Figure 6B:
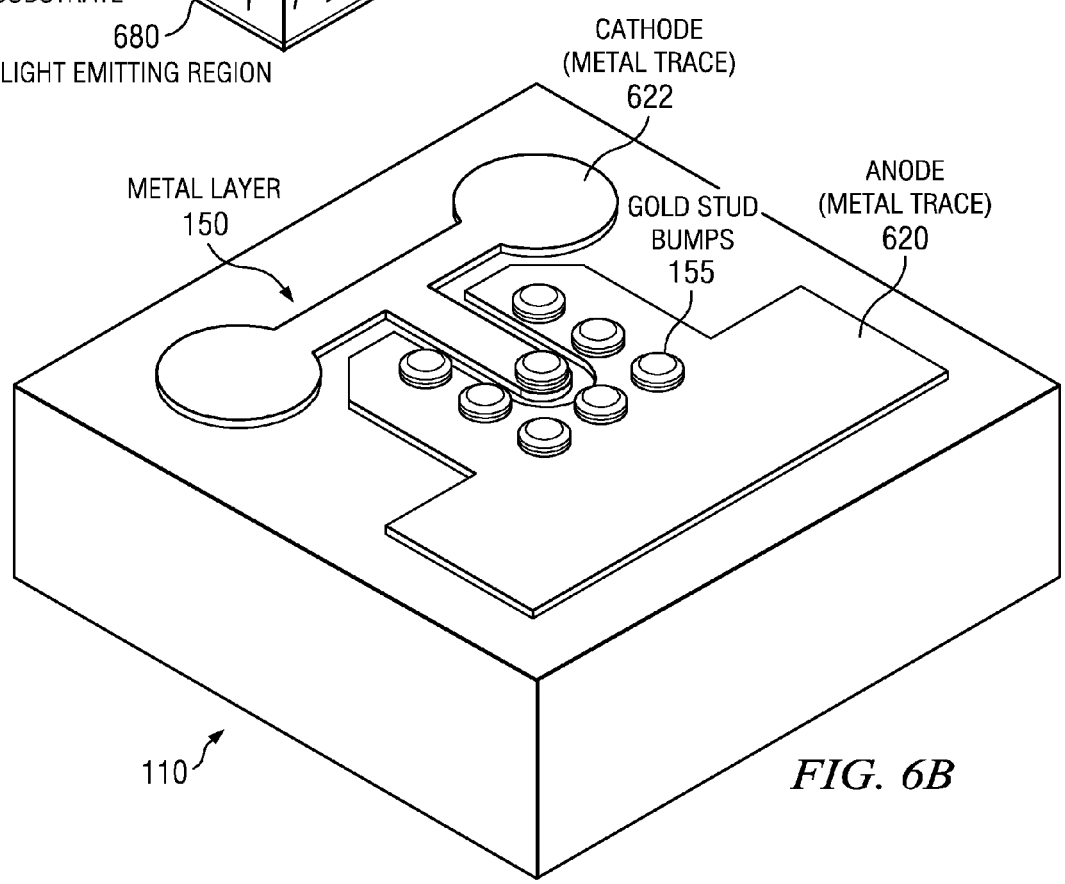
FIG. 6B is diagrammatic representation of a perspective view of an example of one embodiment of a submount configured to support a single LED chip.

FIG. 6B is diagrammatic representation of a perspective view of an example of one embodiment of submount 110. In this example, submount 110 may be configured to support a single LED chip, such as LED chip 120 shown in FIG. 6A. Skilled artisans can appreciate that various known or developed methods, including wire bonding, flip chip, and so on, can be used to interconnect LED chip 120 with metal layer 150 on submount 110. Metal layer 150 may comprise a plurality of sub-layers deposited and/or etched to create metal traces representing cathode 622 and anode 620.

In some embodiments, the Gold-to-Gold Interconnect (GGI) process may be used to attach LED chip 120 to submount 110. The advantage of using the GGI process is the high thermal conductivity of gold stud bumps 155. In some embodiments, solder-based approaches may be used to attach LED chip 120 to submount 110. One advantage of using the GGI process is the high thermal conductivity of gold stud bumps 155.

In some embodiments, the submount and the housing may be sized and dimensioned to accommodate an array of LED chips. Examples of an array of LED chips may include, but are not limited to, an array of four LED chips, an array of nine LED chips, an array of sixteen LED chips, an array of twenty-five LED chips, non-square arrays such as an array of two by seven LED chips, and so on. Because top-emitting LED chips do not require domes, reflectors, or other secondary optics, an LED package disclosed herein can remain similar in dimensions to a LED chip or an array of tightly packed LED chips and keep the overall package size very small. Specifically, the size of a supporting submount for a LED chip can be minimized, so long as the housing requirement is satisfied. This allows the overall package size to be very small as compared to conventional packaged LED devices.

Figure 7:
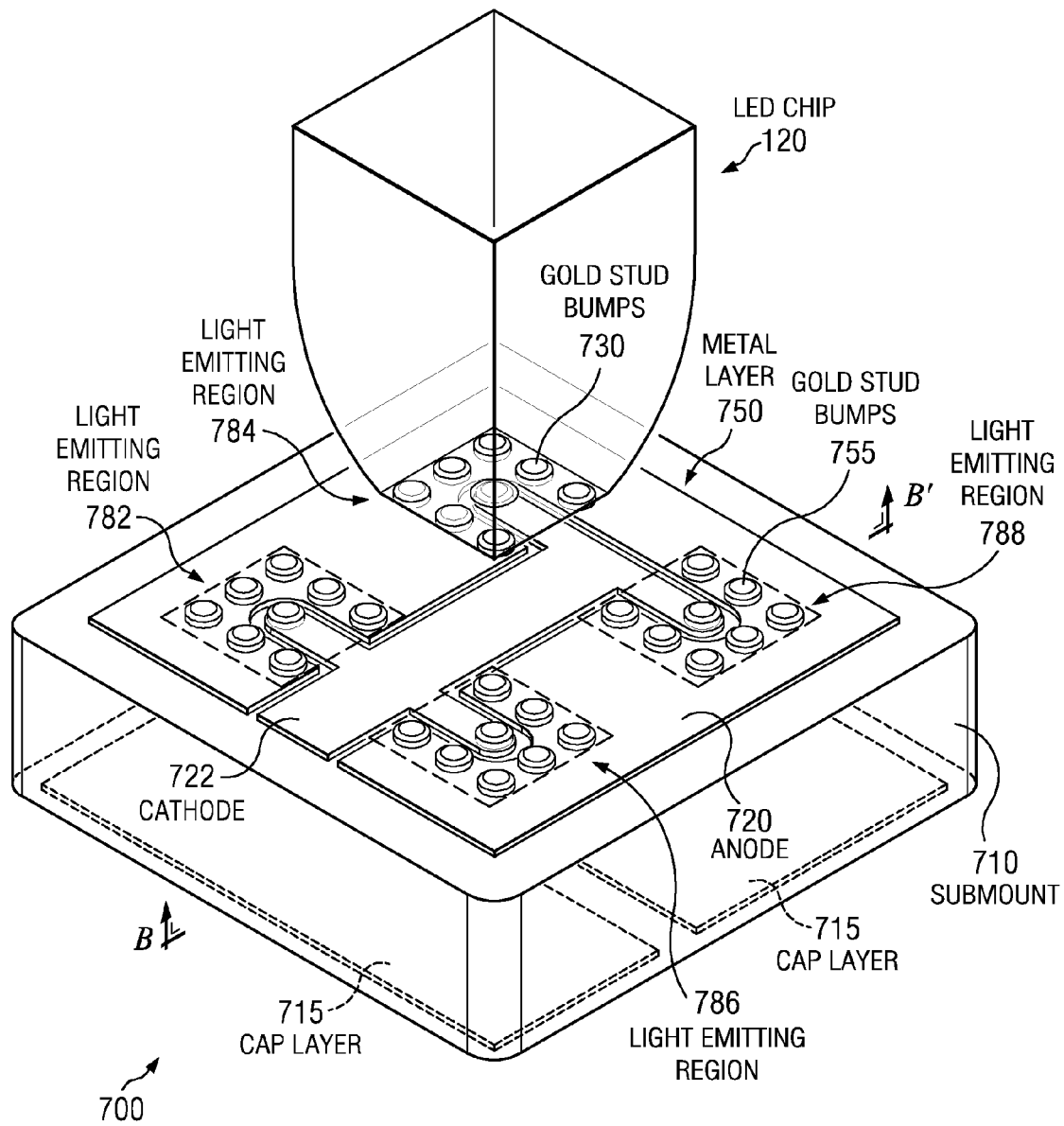
FIG. 7 is a diagrammatic representation of a perspective view of an example of one embodiment of a submount configured to support an array of LED chips.

FIG. 7 is a diagrammatic representation of a perspective view of an example of one embodiment of a portion of packaged LED 700. Packaged LED 700 may comprise housing 730, phosphor plate 740, and submount 710. For the sake of clarity, housing 730 and phosphor plate 740 of packaged LED 700 are not shown in FIG. 7. Housing 730 of packaged LED 700 may be sized and dimensioned to accommodate an array of LED chips 120 in a manner similar to housing 130 or housing 530 described above. In this example, submount 710 may be sized and dimensioned to accommodate array 702 comprising four LED chips 120. As FIG. 7 illustrates, metal layer 750 may comprise cathode 722 and anode 720 arranged to interconnect with light emitting regions 782, 784, 786, and 788 of LED chips 120 with gold stud bumps 755. Vias (not shown) in submount 710, in turn, interconnect gold stud bumps 755 with caps 715. For the sake of simplicity, of array 702 (see FIG. 8), only LED chip 120 with light emitting region 784 is shown in FIG. 7.

Figure 8:
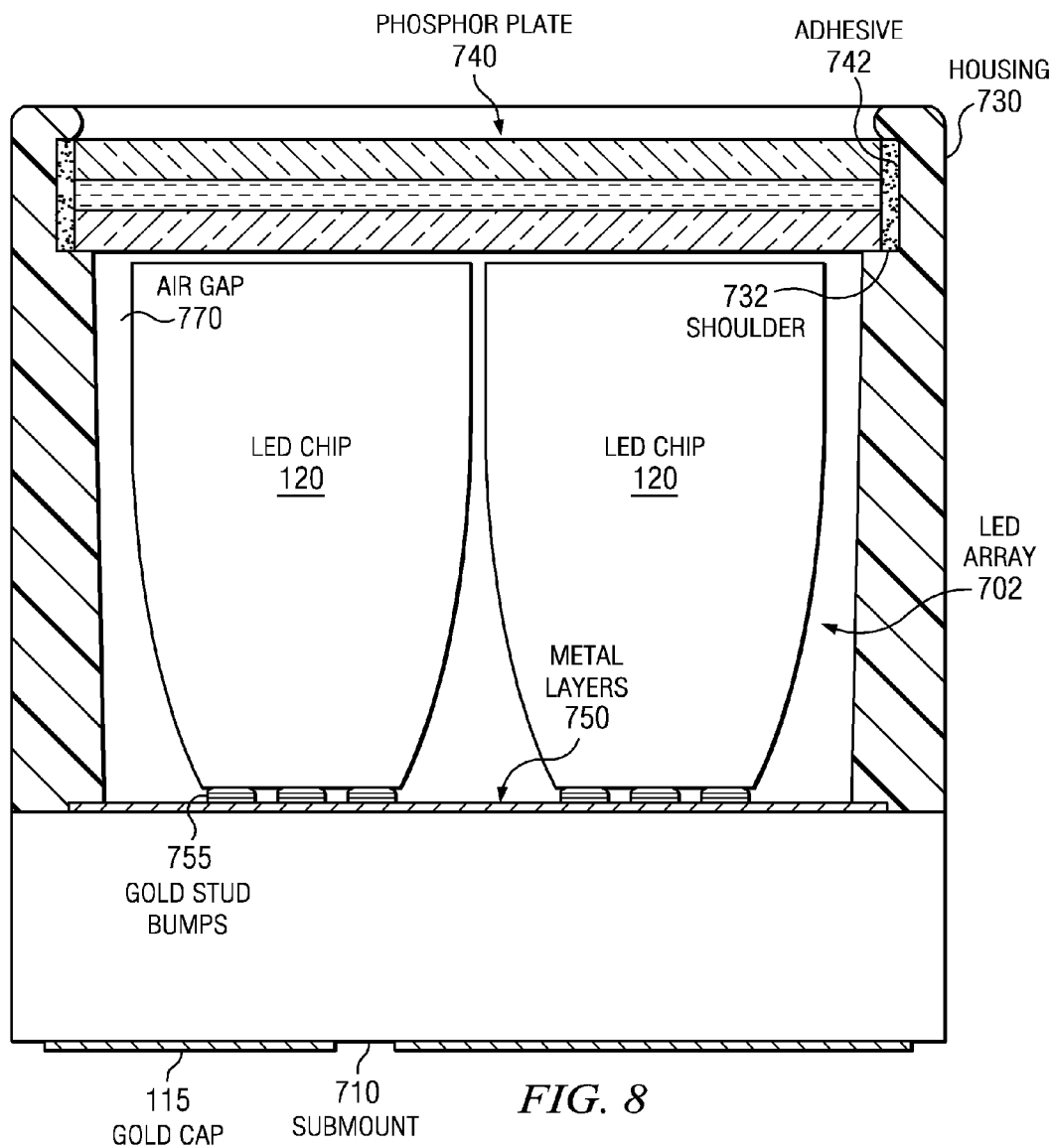
FIG. 8 is a diagrammatic representation of a cross-sectional view of an example of one embodiment of a packaged LED having a housing positioned on a supporting submount, both of which are configured to support an array of LED chips.

FIG. 8 is a diagrammatic representation of a cross-sectional view, generally along the B-B' line shown in FIG. 7, of an example of one embodiment of packaged LED 700 comprising array 702 of LED chips 120. In this example, housing 730 comprising shoulder area 732 for supporting phosphor plate 740 and providing air gap 770 surrounding LED chips 120 in a manner similar to housing 130 described above and phosphor plate 740 is adhered to housing 730 utilizing adhesive 742 in a manner similar to phosphor plate 140 described above with reference to FIG. 4. In some embodiments, housing 730 and phosphor plate 740 may be configured and arranged similar to housing 530 and phosphor plate 540 described above with reference to FIG. 5.

Figure 9:
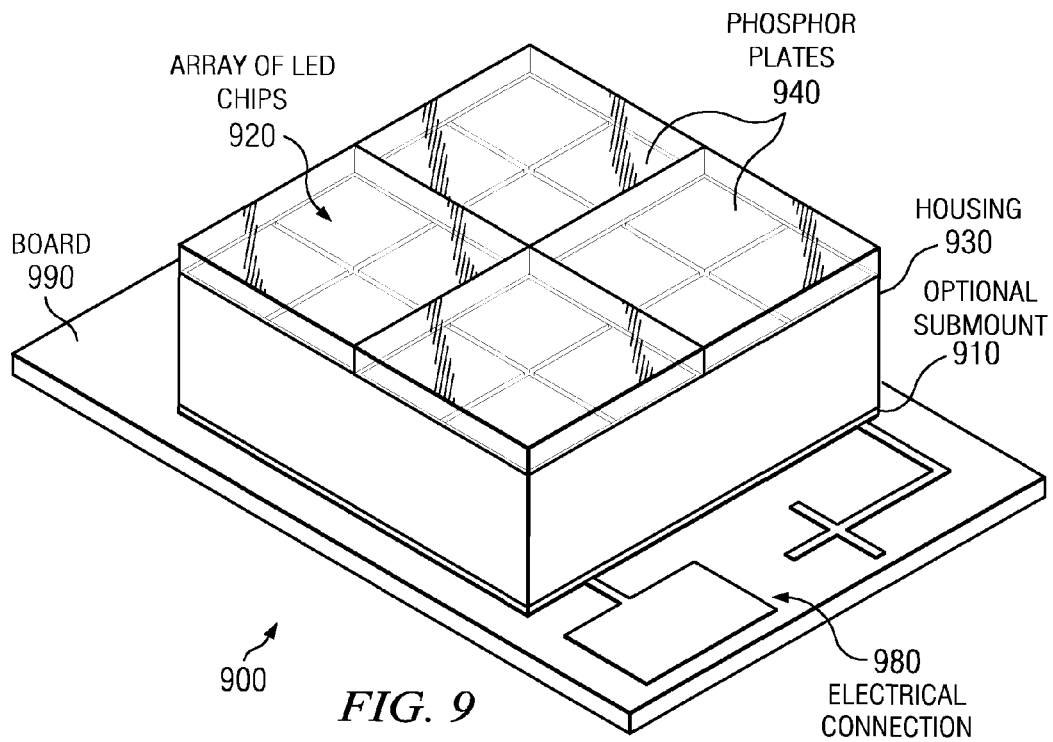
FIG. 9 is a diagrammatic representation of a perspective view of an example of one embodiment of a packaged LED device with an array of tightly packed LED chips.

FIG. 9 is a diagrammatic representation of a perspective view of an example of one embodiment of packaged LED device 900 with array 920 of tightly packed LED chips 120. For the sake of clarity, only exit faces of LED chips 120 are shown in FIG. 9. Packaged LED device 900 may comprise housing 930 and submount 910 sized and dimensioned to house and support array 920. In this example, four phosphor plates 940 are placed on top of housing 930 in a manner similar to phosphor plate 540 described above with reference to FIG. 5. In some embodiments, one or more phosphor plates may be utilized for array 920. In this non-limiting example, array 920 comprises 16 LED chips. Other embodiments of a packaged LED may comprise an array of LED chips other than 16. Moreover, as discussed above, various shapes of housing or enclosure may be configured to house the LED chips. As illustrated in FIG. 9, packaged LED device 900 may further comprise board 990 on which a packaged LED or LEDs may be mounted and connected to electrical connection 980. In some embodiments, submount 910 may not be required in that a packaged LED or an array thereof may be mounted directly on the board. In these embodiments, the board may be constructed of suitable materials to allow mounting of the die directly and eliminating the intermediate submount.

Figure 10:
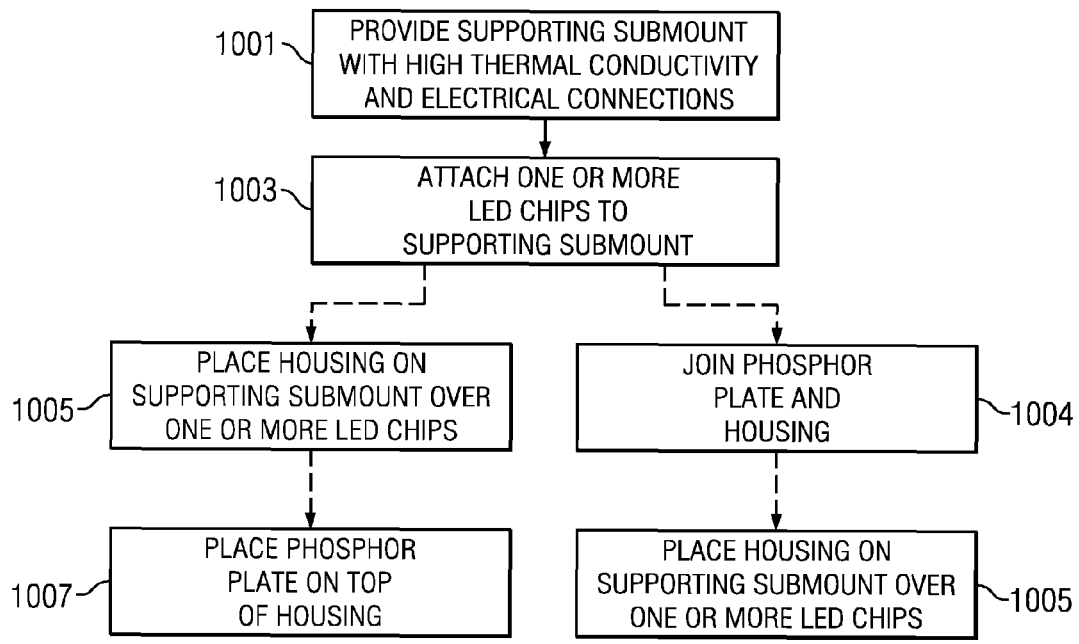
FIG. 10 is a flow diagram illustrating example methods of packaging one or more LED chips.

FIG. 10 is a flow diagram illustrating example methods of packaging one or more LED chips. A method may comprise attaching one or more LED chip (also referred to as an LED structure) to a supporting submount (step 1003). This step may further comprise providing a block of thermally conductive material with metal traces arranged to have a pair of a cathode and an anode on a surface thereof for interconnecting to each light emitting region of an LED chip as described above (step 1001). The submount may have caps and embedded vias connecting the metal traces and the caps as described above. As described above, in some embodiments, the Gold-to-Gold Interconnect process may be utilized to attach the one or more LED structures to the submount. In some embodiments, solder-based approached may be used.

Next, a housing is placed on the supporting submount (step 1005). In some embodiments, this step may further comprise applying a thermal epoxy resin to the bottom perimeter of the housing, to a portion of the top surface of the submount, or both.

In some embodiments, the phosphor plate and the housing are joined prior to adhesion to the submount (step 1004). In some embodiments, the phosphor plate can be positioned within the housing by heat staking. In some embodiments, the phosphor plate can be positioned within the housing using an epoxy that can withstand the high temperature of reflow. In some embodiments, the phosphor plate can be made of glass or a clear polymer that can withstand reflow conditions.

In some embodiments, the phosphor plate can be positioned on top of the housing (step 1007). As mentioned before, a typical method to convert blue light into white light is through the use of phosphors. In a typical LED, phosphor is deposited around the LED to create white light. Some prior systems may mix phosphor and silicone and deposit the phosphor goop over the LED. One problem with this approach is that the phosphor composition thus deposited is not always uniform and therefore the exact color temperatures may vary. Some prior systems may conformal coat the LED and then deposit silicone to protect the phosphor. One problem with this approach of conformal coating is that it is a difficult manufacturing step creating many different color temperature bins.

Generally, one problem with most phosphor deposition process is the light energy that escapes the side of the sapphire. This light has to be controlled just as well as the light that comes out of the top of the LED chip. The light from the sides have to travel through roughly the same phosphor distance as the light from the top. Variation in this thickness will cause color temperature variations. Conformal coating guarantees the same phosphor thickness. However, during the manufacturing process, phosphor may chip from the edge, and thus leak blue light. This leakage will cause color temperature variations.

As discussed above, one unique aspect of the Illumitex LED chip is that light only comes out the top surface (exit face) of the LED chip. This unique technological advantage can simplify phosphor deposition and color temperature control. For example, in some embodiment, phosphor can be deposited on top of an Illumitex LED chip, close to or essentially on the exit face of the LED chip. This is possible because light only comes out the top surface of the LED chip.

Below are multiple exemplary methods that can be used to deposit phosphor on top of an LED chip. One skilled in the art can appreciate that other methods may also be possible.

1. Phosphor particles can be deposited between two glass plates to form a phosphor sandwich. The glass plates serve to protect the phosphor while allowing blue light to enter and white light to escape. There are multiple phosphor configurations. The phosphor may be in a relatively high index material (greater than 1.6 index), a relatively low index material (less than or equal to 1.45), or in air. Phosphor particles in a relatively high index material can suffer from geometric losses. In this case, the phosphor index of refraction and the binder index of refraction are similar and thus scattering is minimized. The high index binder material does not allow light to escape out of the matrix due to Total Internal Reflection (TIR). Phosphors in a relatively low index material can scatter much more due to the index difference. Also, the escape cone for the lower index material is much broader, allowing a higher percentage of light to escape. Phosphors in air can allow yellow light to readily escape the system. In some embodiments, the phosphor would be suspended in air or a low index material. Examples of a phosphor sandwich are illustrated in FIGS. 4 and 8.

2. Phosphor particles can also be deposited directly on the LED and protected by a glass or plastic transparent plate. This requires the LED to be tightly fit into the housing. This is a preferred method since phosphor is only deposited on the exit surface of the LED; thus the exit area of the phosphor is equivalent to the exit area of the LED. This may avoid any loss of brightness. Another advantage is that scattered light can fully be recycled. A key is for the phosphor particles to remain in air.

3. Phosphor can be first applied to a glass plate. The deposition process should ensure that the phosphor sticks to the glass plate while not embedding it in a material of significant index of refraction greater than air. This plate can be cut and placed at the exit of the LED. This plate may be held in place by the housing. FIG. 5 depicts an example of a phosphor plate with a layer of phosphor and a glass plate. In this case, phosphor layer 548 may be deposited directed on LED chip 120 or applied to glass plate 544 first and then placed at the exit face of LED chip 120. FIG. 1 depicts an example of a phosphor plate held in place by a housing.

As a specific example, in some embodiments, a method of manufacturing a phosphor window or a glass-phosphor sandwich may comprise applying a thin coat of an epoxy onto a glass substrate. In some embodiment, this epoxy coating may be approximately 5 to 10 μm in depth. The method may further comprise stenciling a grid of metal or plastic material on top of the thin coat of epoxy. This grid is left in place to create a plurality of pockets. Next, phosphor is deposited onto the thin coat of epoxy on the glass substrate, filling the plurality of pockets with a layer of phosphor having a uniform depth. In some embodiment, phosphor may be deposited using spin coating. In some embodiments, a protection layer may be added on top of the phosphor layer. In some embodiments, this protection layer may be of a glass or clear polymer that can withstand reflow conditions. The glass substrate with a layer of phosphor having a uniform depth may be cut or machined to produce individual phosphor plates.

Although the present disclosure has been described in detail herein with reference to the illustrative embodiments, it should be understood that the description is by way of example only and is not to be construed in a limiting sense. It is to be further understood, therefore, that numerous changes in the details of the embodiments disclosed herein and additional embodiments will be apparent to, and may be made by, persons of ordinary skill in the art having reference to this description. Accordingly, the scope of the present disclosure should be determined by the following claims and their legal equivalents.

What is claimed is:

1. A packaged light-emitting diode (LED) device, comprising:
   a housing having a cavity;
   a phosphor plate on top or within the housing;
   a submount attached to the housing, wherein the submount comprises metal traces, vias, or a combination thereof; and
   at least one LED chip residing in the cavity of the housing between the phosphor plate and the submount and comprising a substrate and a light emitting region, wherein the substrate comprises a side wall and an exit face on top of the side wall, wherein all or substantially all rays of light emitting from the light emitting region exit the exit face with negligible or substantially negligible side emission through the side wall of the substrate, and wherein the light emitting region is connected to the metal traces of the submount inside the housing through an electrically conductive contact area.

2. The packaged LED device according to claim 1, wherein the phosphor plate comprises a glass or clear polymer plate and a phosphor layer.

3. The packaged LED device according to claim 1, wherein the phosphor plate comprises a phosphor layer sandwiched between two plates and wherein the two plates are made of glass or clear polymer capable of withstanding reflow temperatures.

4. The packaged LED device according to claim 1, wherein the at least one LED chip and the phosphor plate is separated by an air gap or a low index optical coupling material.

5. The packaged LED device according to claim 1, further comprises an array of LED chips including the at least one LED chip.

6. The packaged LED device according to claim 5, wherein the housing and the submount are configured to support the array of LED chips.

7. The packaged LED device according to claim 1, wherein the housing comprises a three-dimensional structure with a top opening, a bottom opening, and at least three sides between the top opening and the bottom opening.

8. The packaged LED device according to claim 1, wherein the housing comprises an interior wall and wherein the interior wall defines the cavity of the housing.

9. The packaged LED device according to claim 8, wherein the interior wall is tapered.

10. The packaged LED device according to claim 8, wherein the at least one LED chip and the interior wall is separated by an air gap, a low index optical coupling material, or a combination thereof.

11. The packaged LED device according to claim 8, wherein the housing comprises a top opening through which the phosphor plate is visible, a lip around the top opening of the housing, and a shoulder area on top of the interior wall, and wherein the phosphor plate rests on the shoulder area and is held in place by the lip around the top opening of the housing.

12. The packaged LED device according to claim 1, wherein the phosphor plate is attached to the housing utilizing an adhesive capable of withstanding reflow temperatures.

13. The packaged LED device according to claim 1, wherein the submount is made of a material with high thermal conductivity.

14. The packaged LED device according to claim 1, wherein the submount is made of a material selected from a group consisting of silicon, aluminum nitride, metal, flex circuit copper, aluminum, alumina ceramic, beryllium oxide ceramic, high temperature cofire ceramic, and low temperature cofire ceramic.

15. The packaged LED device according to claim 1, wherein the housing is made of a liquid crystal polymer.

16. The packaged LED device according to claim 1, wherein the electrically conductive contact area comprises a plurality of gold stud bumps.

17. The packaged LED device according to claim 1, wherein the electrically conductive contact area comprises a plurality of soldered bumps.

18. The packaged LED device according to claim 1, wherein the housing and the submount have same or substantially same footprint.

19. The packaged LED device according to claim 18, wherein the footprint is approximately 1 mm by 1 mm.

20. A method for packaging a light-emitting diode (LED), comprising:
providing a submount, wherein the submount comprises metal traces, vias, or a combination thereof;
attaching one or more LED chips to the submount, wherein each of the one or more LED chips comprises a substrate and a light emitting region, wherein the substrate comprises a side wall and an exit face on top of the side wall, wherein all or substantially all rays of light emitting from the light emitting region exit the exit face with negligible side emission through the side wall of the substrate, and wherein the light emitting region is connected to the metal traces of the submount inside the housing through an electrically conductive contact area;
placing a housing on the submount over the one or more LED chips; and
positioning a phosphor plate on top of or within the housing.

21. The method according to claim 20, further comprising applying a thermal epoxy resin to the bottom perimeter of the housing, to a portion of the top surface of the submount, or both, prior to placing the housing on the submount.

22. The method according to claim 20, wherein the phosphor plate is positioned within the housing, further comprising joining the phosphor plate and the housing prior to positioning the phosphor plate within the housing.

23. The method according to claim 20, wherein positioning the phosphor plate further comprises deforming a portion of the housing.

24. The method according to claim 20, wherein the metal traces define a pair of a cathode and an anode on a surface of the submount.

25. The method according to claim 20, further comprising utilizing a Gold-to-Gold Interconnect process or a soldering process to attach the one or more LED chips to the submount.

26. The method according to claim 20, wherein the phosphor plate is one of a plurality of phosphor plates positioned on top of the housing, further comprising manufacturing the plurality of phosphor plates by:
applying a thin coat of an epoxy onto a glass substrate;
stenciling a grid of metal or plastic material on top of the thin coat of epoxy to create a plurality of pockets;
depositing phosphor onto the thin coat of epoxy on the glass substrate, filling the plurality of pockets with a layer of phosphor having a uniform depth; and
cutting the glass substrate to produce the plurality of phosphor plates.

27. The method according to claim 26, further comprising utilizing spin coating to deposit phosphor onto the thin coat of epoxy.

28. The method according to claim 26, further comprising applying a protection layer on top of the layer of phosphor.

29. The method according to claim 28, wherein the protection layer is made of glass or clear polymer capable of withstanding reflow conditions.

30. The method according to claim 26, wherein the thin coat of epoxy is approximately 5 to 10 μm in depth.

* * * * *